United States Patent
Chen et al.

(10) Patent No.: US 12,550,652 B2
(45) Date of Patent: Feb. 10, 2026

(54) WAFER EDGE TRIMMING PROCESS INCLUDING WATER JET AND WEDGE SEPARATION AND METHODS THEREOF

(71) Applicant: Taiwan Semiconductor Manufacturing Co., Ltd., Hsinchu (TW)

(72) Inventors: Fang-I Chen, New Taipei (TW); Pei-Keng Tsai, New Taipei (TW); Hui-Chi Huang, Zhubei (TW)

(73) Assignee: Taiwan Semiconductor Manufacturing Co., Ltd., Hsinchu (TW)

( * ) Notice: Subject to any disclaimer, the term of this patent is extended or adjusted under 35 U.S.C. 154(b) by 492 days.

(21) Appl. No.: 18/297,946

(22) Filed: Apr. 10, 2023

(65) Prior Publication Data

US 2024/0339326 A1   Oct. 10, 2024

(51) Int. Cl.
*H01L 21/304*   (2006.01)
*H01L 21/67*   (2006.01)
*H01L 21/687*   (2006.01)

(52) U.S. Cl.
CPC ...... *H01L 21/304* (2013.01); *H01L 21/67051* (2013.01); *H01L 21/67288* (2013.01); *H01L 21/68714* (2013.01)

(58) Field of Classification Search
CPC ............. H01L 21/304; H01L 21/67051; H01L 21/67288; H01L 21/68714; H01L 21/02021; H01L 21/67092
See application file for complete search history.

(56) References Cited

U.S. PATENT DOCUMENTS

| | | | |
|---|---|---|---|
| 2001/0003668 A1* | 6/2001 | Yanagita | H01L 21/67092 438/455 |
| 2002/0081822 A1* | 6/2002 | Yanagita | H01L 21/76259 438/455 |
| 2015/0151335 A1 | 6/2015 | Nishida et al. | |
| 2018/0185957 A1 | 7/2018 | Swoboda et al. | |
| 2020/0027773 A1* | 1/2020 | Lin | H01L 21/78 |
| 2021/0039203 A1 | 2/2021 | Tanoue | |
| 2021/0043473 A1 | 2/2021 | Minato et al. | |
| 2022/0181173 A1 | 6/2022 | Landru et al. | |

FOREIGN PATENT DOCUMENTS

| | | |
|---|---|---|
| CN | 107820453 A | 3/2018 |
| TW | 200729324 A | 8/2007 |
| TW | 201535490 A | 9/2015 |
| TW | 201939597 A | 10/2019 |
| TW | 202107555 A | 2/2021 |

* cited by examiner

*Primary Examiner* — John P. Dulka
(74) *Attorney, Agent, or Firm* — Slater Matsil, LLP

(57) ABSTRACT

A method of trimming a wafer includes securing the wafer on a top surface of a wafer chuck of a wafer edge trimming apparatus, directing a water jet at an edge of the wafer to form a plurality of cracks at uniform intervals along the edge of the wafer, inserting a wedge of a removal module into a first crack of the plurality of cracks, and rotating the wafer, where during the rotation of the wafer, the wedge expands the first crack of the plurality of cracks and removes material from the edge of the wafer.

20 Claims, 17 Drawing Sheets

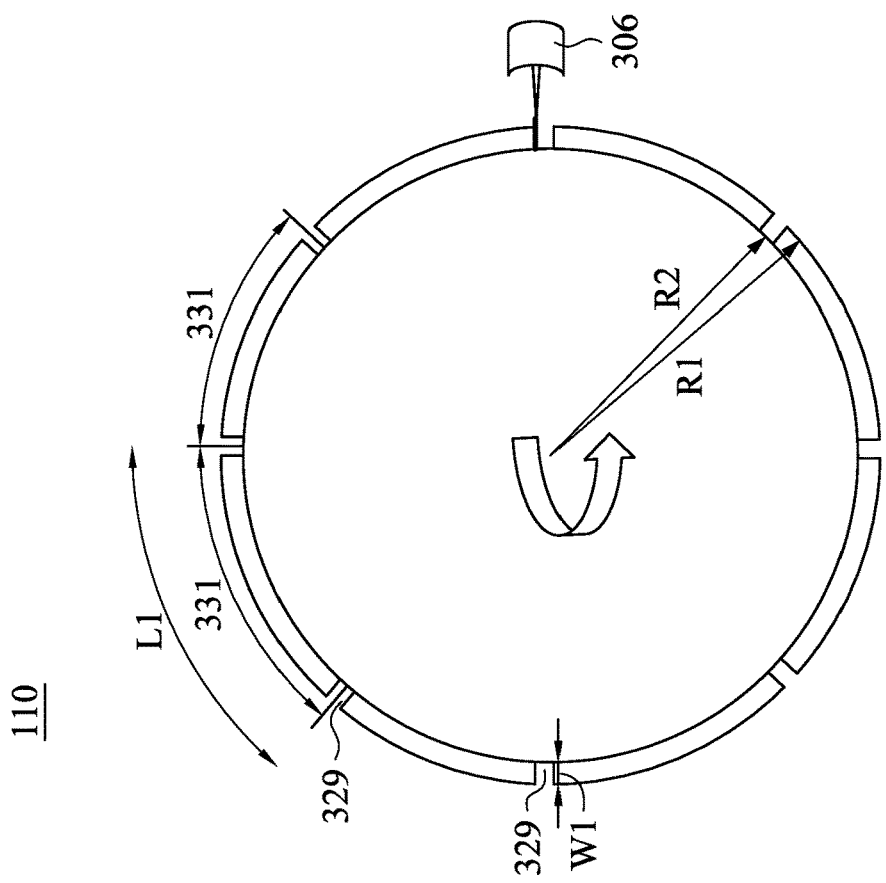
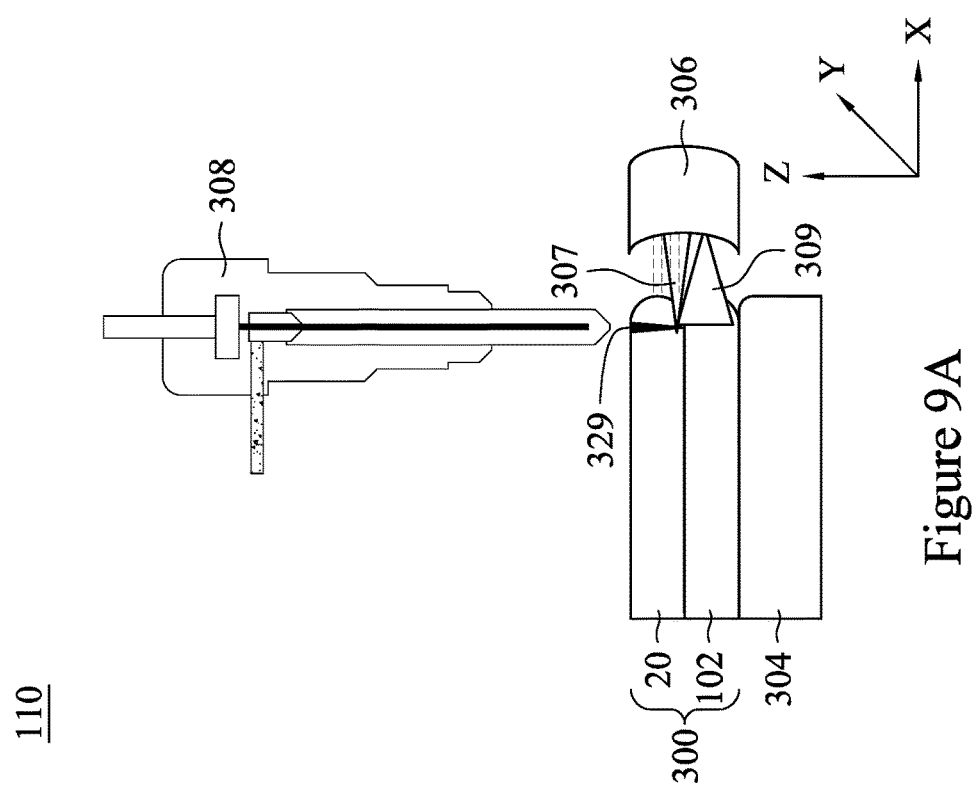
Figure 9B
Figure 9A

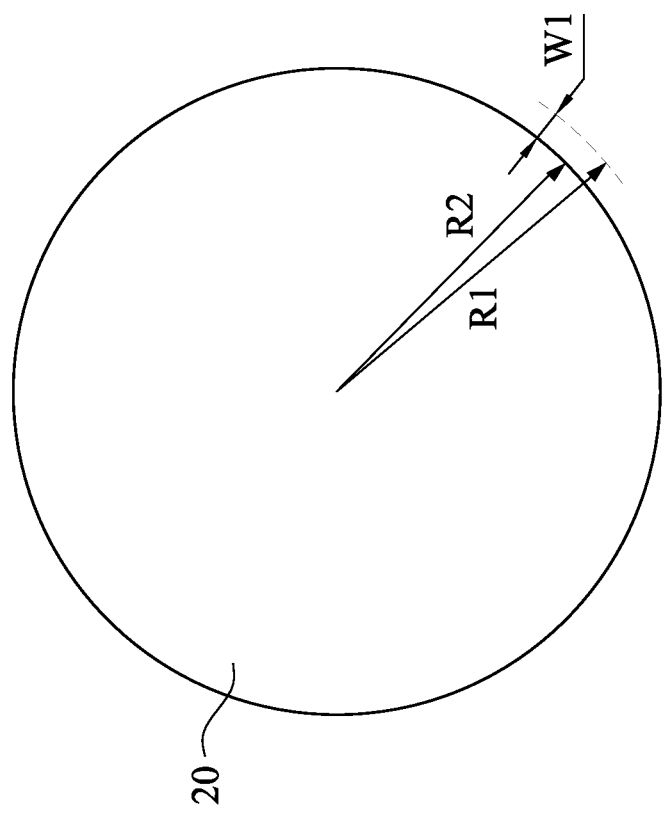

WAFER EDGE TRIMMING PROCESS INCLUDING WATER JET AND WEDGE SEPARATION AND METHODS THEREOF

BACKGROUND

Semiconductor devices are used in a variety of electronic applications, such as personal computers, cell phones, digital cameras, and other electronic equipment, as examples. Semiconductor devices are typically fabricated by sequentially depositing insulating or dielectric layers, conductive layers, and semiconductive layers of material over a semiconductor substrate, and patterning the various material layers using lithography to form circuit components and elements thereon. Dozens or hundreds of integrated circuits are typically manufactured on a single semiconductor wafer. The beveled edge of the semiconductor wafer is then trimmed, after which a wafer thinning process is performed on the semiconductor wafer. The individual dies are singulated by sawing the integrated circuits along a scribe line. The individual dies are then packaged separately, in multi-chip modules, or in other types of packaging, for example.

The semiconductor industry continues to improve the integration density of various electronic components (e.g., transistors, diodes, resistors, capacitors, etc.) by continual reductions in minimum feature size, which allow more components to be integrated into a given area.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 1 through 3A illustrate cross-sectional views of intermediate steps during a process for singulating semiconductor dies from a wafer, in accordance with some embodiments.

FIGS. 9A and 9B illustrate a cross-sectional view and a top-down view of an intermediate step during a wafer edge trimming process, in accordance with some embodiments.

FIGS. 10A, 10B, and 10C illustrate cross-sectional views and a top-down view of an intermediate step during a wafer edge trimming process, in accordance with some embodiments.

DETAILED DESCRIPTION

Figure 1:
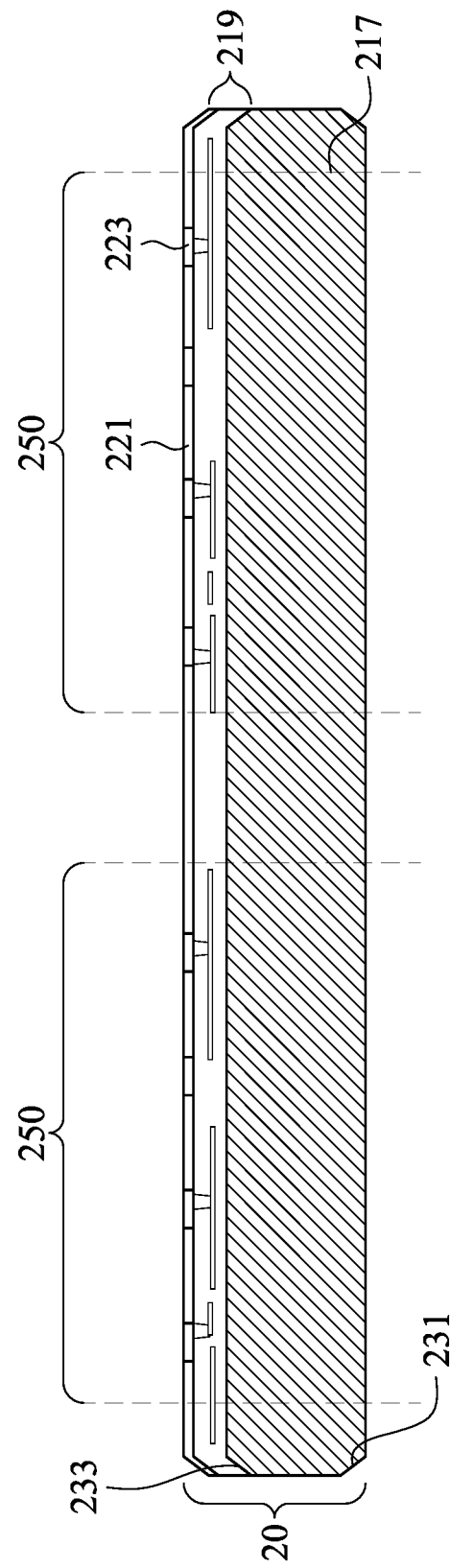

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Various embodiments provide methods applied to trimming the edges of a first wafer (e.g., a device wafer) that comprises a number of semiconductor dies. An edge trimming process is performed using a wafer trimming apparatus to trim edges of the first wafer. The edge trimming process comprises using a water jet having one or more mixed-in abrasives to cut through materials of the first wafer. Advantageous features of one or more embodiments disclosed herein may include eliminating thermal damage (e.g., by using the edge trimming process instead of a laser trimming process) to the first wafer. In addition, blade wear is eliminated (e.g., by using the edge trimming process instead of a blade trimming process) and blade maintenance requirements (e.g., blade dressing) are also eliminated. As a result, the use of the wafer trimming apparatus allows edge trimming operations to be performed at a faster rate with lower maintenance requirements, thereby increasing the wafer per hour (WPH) processing rate.

FIGS. 1, 2, 3A, 3B, 4, 8A, 9A, 10A, 10C, 11, 12, 13A, 13B, 13C and 13D illustrate cross-sectional views of intermediate steps during a process for singulating semiconductor dies 250 from a wafer 20 (e.g., a device wafer). In FIG. 1, a wafer 20 is illustrated. The wafer 20 comprises semiconductor dies 250. Each of the semiconductor dies 250 may be a logic die (e.g., application processor (AP), central processing unit, microcontroller, etc.), a memory die (e.g., dynamic random access memory (DRAM) die, hybrid memory cube (HBC), a static random access memory (SRAM) die, a wide input/output (wideIO) memory die, a magnetoresistive random access memory (mRAM) die, a resistive random access memory (rRAM) die, etc.), a power management die (e.g., power management integrated circuit (PMIC) dies), a radio frequency (RF) die, a sensor die, a micro-electro-mechanical-system (MEMS) die, a signal processing die (e.g., digital signal processing (DSP) die), a front-end die (e.g., analog front-end (AFE) die), a biomedical die, or the like. Each semiconductor die 250 may also be a System-on-Chip (SoC) die, or the like. Although two semiconductor dies 250 are explicitly illustrated, the wafer 20 may include any number of semiconductor dies 250. The wafer 20 may include a substrate 217 (e.g., a semiconductor substrate), an interconnect structure 219 disposed on the substrate 217, a bonding layer 221 disposed on the interconnect structure 219, and bonding pads 223 disposed in the bonding layer 121 and exposed at the front surface of the wafer 20.

The substrate 217 of the wafer 20 may include a crystalline silicon wafer. The substrate 217 may include various doped regions depending on design requirements (e.g., p-type substrate or n-type substrate). In some embodiments, the doped regions may be doped with p-type or n-type dopants. The doped regions may be doped with p-type dopants, such as boron or $BF_2$; n-type dopants, such as phosphorus or arsenic; and/or combinations thereof. The doped regions may be configured for n-type Fin-type Field Effect Transistors (FinFETs) and/or p-type FinFETs. In some alternative embodiments, the substrate 217 may comprise an active layer of a semiconductor-on-insulator (SOI) substrate. The substrate 217 may include other semiconductor materials, such as germanium; a compound semiconductor including silicon carbide, gallium arsenic, gallium phosphide, indium phosphide, indium arsenide, and/or indium antimonide; an alloy semiconductor including SiGe, GaAsP, AlInAs, AlGaAs, GaInAs, GaInP, and/or GaInAsP; or combinations thereof. Other substrates, such as multi-layered or gradient substrates, may also be used. The substrate 217 of the wafer 20 may be provided to have bevels (e.g., lower bevels 231 and upper bevels 233).

Active and/or passive devices, such as transistors, diodes, capacitors, resistors, etc., may be formed in and/or on the substrate 217. The devices may be interconnected by the interconnect structure 219. The interconnect structure 219 electrically connects the devices on the substrate 217 to form one or more integrated circuits. The interconnect structure 219 may include one or more dielectric layers (for example, one or more interlayer dielectric (ILD) layers, intermetal dielectric (IMD) layers, or the like) and interconnect wirings or metallization patterns embedded in the one or more dielectric layers. The material of the one or more dielectric layers may include silicon oxide ($SiO_x$, where x>0), silicon nitride ($SiN_x$, where x>0), silicon oxynitride ($SiO_xN_y$, where x>0 and y>0), or other suitable dielectric material. The interconnect wirings may include metallic wirings. For example, the interconnect wirings include copper wirings, copper pads, aluminum pads or combinations thereof that are formed by one or more single damascene processes, dual damascene processes, or the like.

The bonding layer 221 may comprise a dielectric layer. Bonding pads 223 are embedded in the bonding layer 221, and the bonding pads 223 allow connections to be made to the interconnect structure 219 and the devices on the substrate 217. The material of the bonding layer 221 may be silicon oxide ($SiO_x$, where x>0), silicon nitride ($SiN_x$, where x>0), silicon oxynitride ($SiO_xN_y$, where x>0 and y>0), tetraethyl orthosilicate (TEOS), or other suitable dielectric material, and the bonding pads 223 may comprise conductive pads (e.g., copper pads), conductive vias (e.g., copper vias), or combinations thereof. The bonding layer 221 may be formed by depositing a dielectric material over the interconnect structure 219 using a chemical vapor deposition (CVD) process (e.g., a plasma enhanced CVD process or other suitable process); patterning the dielectric material to form the bonding layer 221 including openings or through holes; and filling conductive material in the openings or through holes defined in the bonding layer 221 to form the bonding pads 223 embedded in the bonding layer 221. Because the edges of the substrate 217 have bevels (e.g., the lower bevels 231 and the upper bevels 233), edges of the interconnect structure 219 and edges of the bonding layer 221 that overlap the upper bevels 233 may also be sloping as a result of the deposition processes used to form the interconnect structure 219 and the bonding layer 221.

Figure 2:
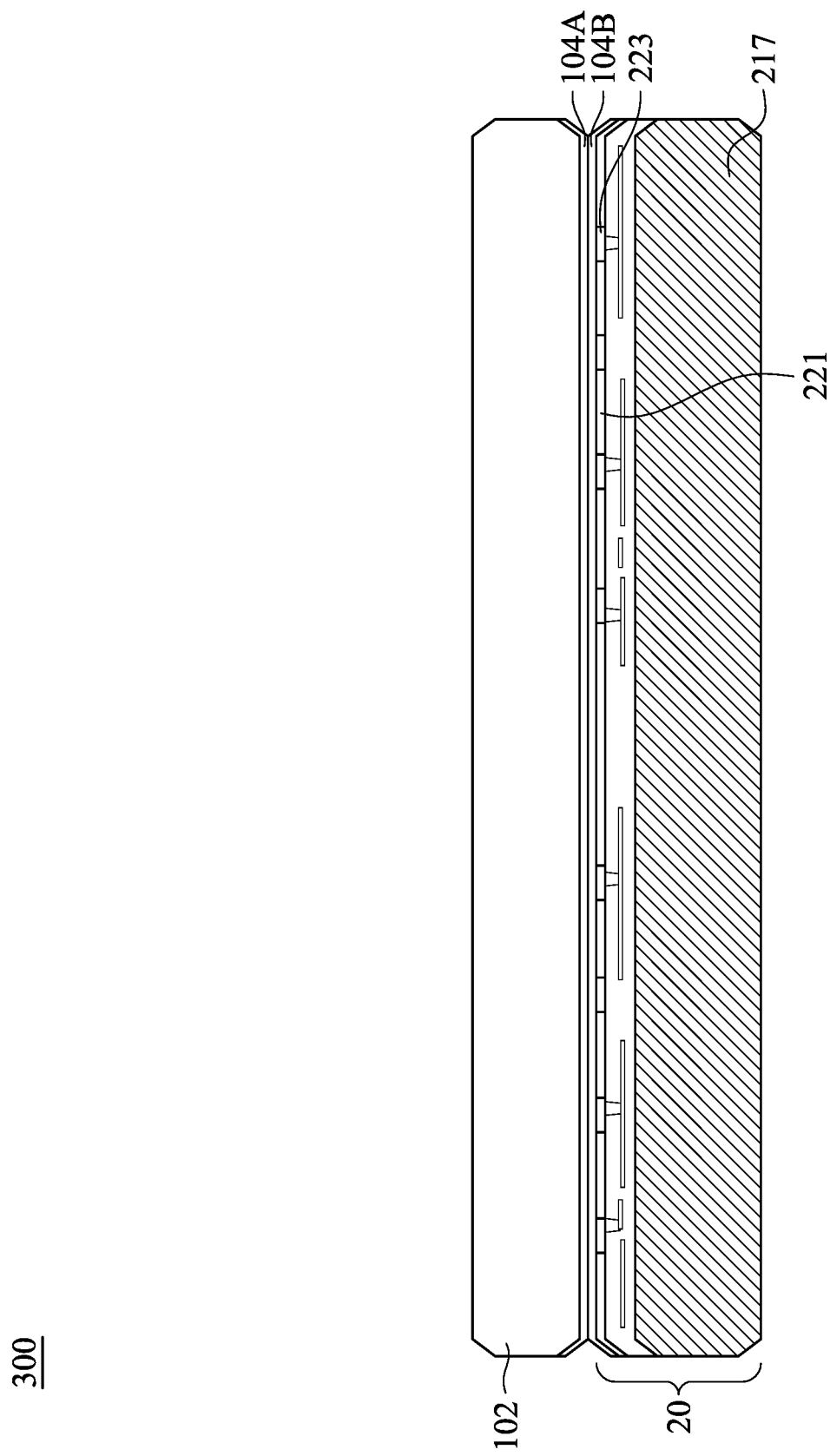

In FIG. 2, a carrier substrate 102 is provided. The carrier substrate 102 may be a semiconductor wafer (e.g., a crystalline silicon wafer), a glass carrier substrate, a ceramic carrier substrate, a silicon based carrier substrate (e.g., comprising silicon oxide), or the like. The carrier substrate 102 may be a wafer. The edges of the carrier substrate 102 may have bevels.

The wafer 20 (described previously in FIG. 1) is attached to the carrier substrate 102 to form a wafer 300. The wafer 20 is attached to the carrier substrate 102 in a face-up manner, such that the front surface of the wafer 20 is attached to the carrier substrate 102. The front surface of the wafer 20 is bonded to a surface of the carrier substrate 102 using a suitable technique such as dielectric-to-dielectric bonding, or the like. For example, in various embodiments, the wafer 20 may be bonded to the carrier substrate 102 using dielectric-to-dielectric bonding by use of a bonding layer 104B and a bonding layer 104A on the surfaces of the wafer 20 and the carrier substrate 102, respectively. In some embodiments, the bonding layer 104B and the bonding layer 104A may each comprise silicon oxide, silicon oxynitride, silicon nitride, or the like that are formed on the surfaces of the wafer 20 and the carrier substrate 102, respectively. The bonding layers 104A and 104B may be formed by a deposition process, such as chemical vapor deposition (CVD), physical vapor deposition (PVD), or the like. In some embodiments, the bonding layer 104A may be formed by the thermal oxidation of a silicon surface on the carrier substrate 102 while the bonding layer 102B is deposited on the from surface of the wafer 20.

Prior to bonding, at least one of the bonding layers 104A or 104B may be subjected to a surface treatment. The surface treatment may include a plasma treatment. The plasma treatment may be performed in a vacuum environment. After the plasma treatment, the surface treatment may further include a cleaning process (e.g., a rinse with deionized water, or the like) that may be applied to the bonding layers 104A and/or bonding layer 104B. The carrier substrate 102 is then aligned and then pressed against the wafer 20 to initiate a pre-bonding of the wafer 20 to the carrier substrate 102. The pre-bonding may be performed at room temperature (between about 20 degrees and about 25 degrees). The bonding time may be shorter than about 1 minute, for example. After the pre-bonding, the wafer 20 and the carrier substrate 102 are bonded to each other. The bonding process may be strengthened by a subsequent annealing step. For example, this may be done by heating the wafer 20 and the carrier substrate 102 to a temperature of about 170 degrees for about 1 hour.

In other embodiments, the bonding layers 104A/104B include a release layer, such as an epoxy-based thermal-release material, which loses its adhesive property when heated, such as a light-to-heat-conversion (LTHC) release coating; an ultra-violet (UV) glue, which loses its adhesive property when exposed to UV light; or the like. In other embodiments, the bonding layers 104A/104B include an adhesive, such as a suitable epoxy, a die attach film (DAF), or the like. The bonding layers 104A/104B may be applied to the front surface of the wafer 20 and/or may be applied over the surface of the carrier substrate 102.

Figure 3A:
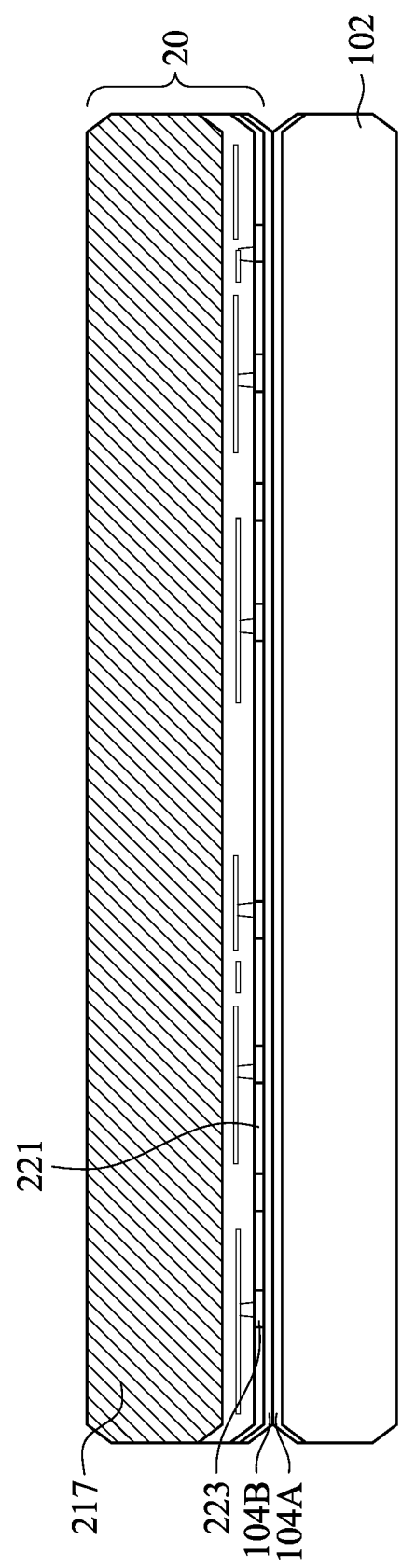

In FIG. 3A, the structure shown in FIG. 2 is flipped over such that the wafer 20 is disposed over and is supported by the carrier substrate 102.

Figure 3B:
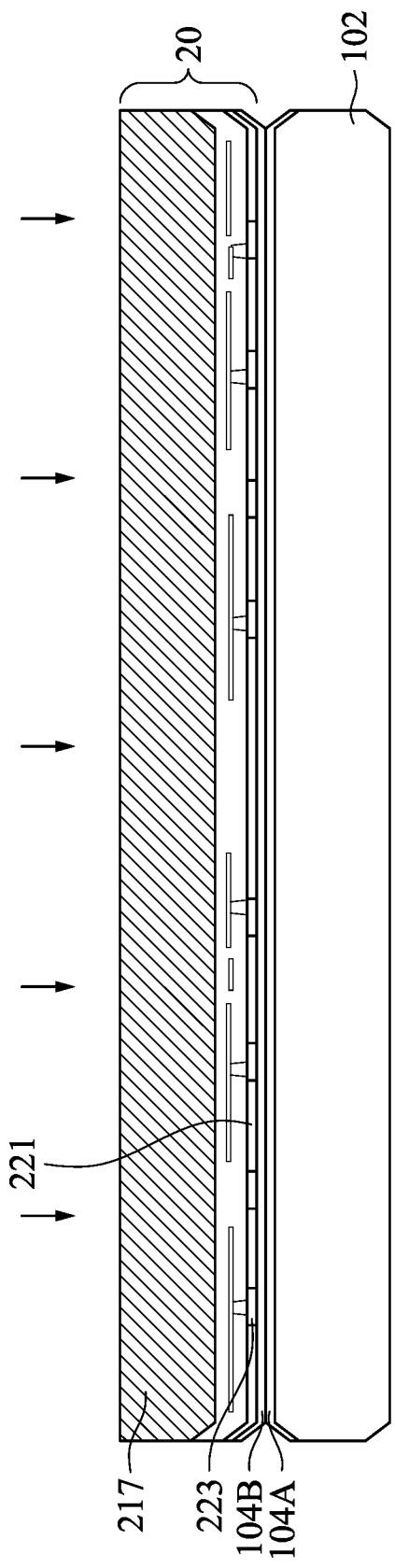
FIG. 3B illustrates a cross-sectional view of an intermediate step during a process for singulating semiconductor dies from a wafer, in accordance with an alternate embodiment.

FIG. 3B illustrates an alternative embodiment. Unless specified otherwise, like reference numerals in this embodiment (and subsequently discussed embodiments) represent like components in the embodiment shown in FIGS. 1 through 3A formed by like processes. Accordingly, the process steps and applicable materials may not be repeated herein. FIG. 3B shows an optional thinning process that is performed on a back surface of the wafer 20 shown in FIG. 3A, to reduce a thickness of the substrate 217. For example, the thinning process may include planarizing a surface of the substrate 217 using CMP, grinding, or the like. If the optional thinning process described above and shown in FIG. 3B is omitted, a thinning process (described subsequently in FIG. 11) to reduce the thickness of the substrate 217 is performed after an edge trimming process 106 (described subsequently in FIGS. 4 through 10C) is performed on the wafer 20.

Figure 4:
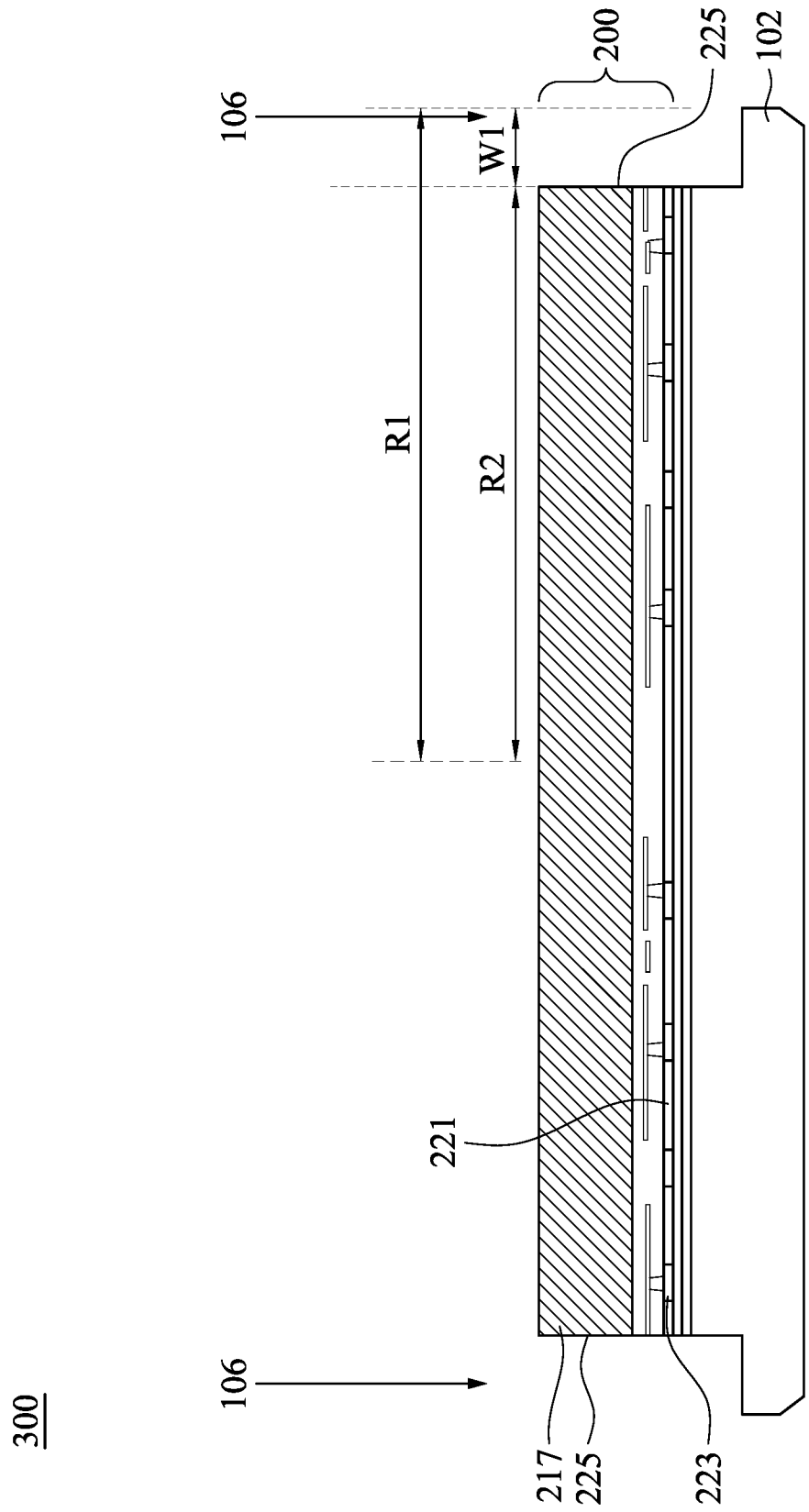
FIG. 4 illustrates a cross-sectional view of an intermediate step during a process for singulating semiconductor dies from a wafer, in accordance with some embodiments.

FIG. 4 illustrates an edge trimming process 106 that is performed to trim the edges of the wafer 20 such that vertical sidewalls 225 are formed about the entire periphery of the wafer 20. The edge trimming process 106 may remove edge portions of the wafer 20 around the entire perimeter of the wafer 20, the removed portions having a width W1 from outermost edges of the wafer 20. Before the edge trimming process 106 is performed, a radius from a center of the wafer 20 to outermost edges of the wafer 20 may be equal to a radius R1. After the edge trimming process 106 is performed, a radius from a center of the wafer 20 to outermost edges of the wafer 20 may be equal to a radius R2 that is smaller than the radius R1. A difference between the radius R1 and the radius R2 is equal to the width W1. In an embodiment, the edge trimming process 106 may also partially remove edge portions of a top region of the carrier substrate 102 around the entire perimeter of the carrier substrate 102. After the edge trimming process 106, a radius of the top region of the carrier substrate 102 from a center of the carrier substrate 102 to outermost edges of the top region of carrier substrate 102 may be equal to the radius R2. After the edge trimming process 106, a radius of a bottom region of the carrier substrate 102 from a center of the carrier substrate 102 to outermost edges of the bottom region of the carrier substrate 102 maybe larger than the radius R2. In an embodiment, a vertical sidewall 225 of the wafer 20 and a vertical sidewall of the top region of the carrier substrate 102 are laterally coterminous. Details of the edge trimming process 106 are described subsequently in conjunction with FIGS. 5 through 10C.

Figure 5:
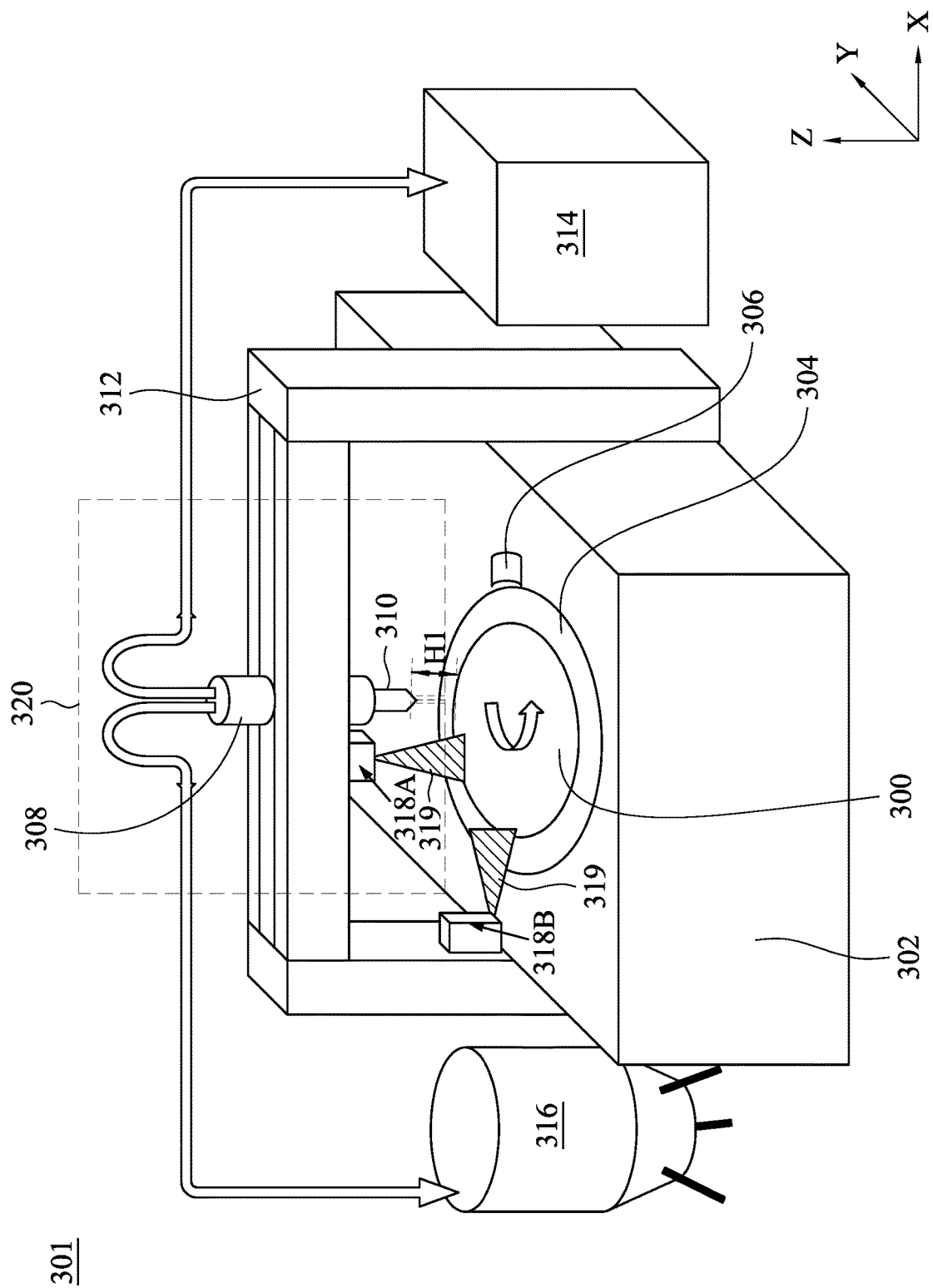
FIG. 5 illustrates a perspective view of a wafer edge trimming apparatus, in accordance with some embodiments.

FIG. 5 illustrates an edge trimming apparatus 301 that is used to perform the edge trimming process 106 (described previously in FIG. 4) on the wafer 300. The edge trimming apparatus 301 comprises a wafer platen 302 that is used to support a wafer (e.g., the wafer 300) while performing an edge trimming process (e.g., the edge trimming process 106) on the wafer. In an embodiment the wafer platen 302 comprises a wafer chuck 304 having a top surface that has a series of openings along the length of the top surface that are connected to a vacuum pump. During operation, the vacuum pump will evacuate any gases from the series of openings along the length of the top surface of the wafer chuck 304, thereby lowering the pressure (also referred to as the chuck pressure) within these openings. The wafer chuck 304 is used to hold or secure the wafer 300 against the top surface of the wafer chuck 304 during the edge trimming process 106. The wafer chuck 304 can rotate in order to rotate the supported wafer 300, and a rotational speed of the wafer chuck 304 and the wafer 300 during the edge trimming process 106 may be in a range from 50 revolutions per minute to 1000 revolutions per minute. In addition, the wafer chuck 304 may be able to support a wafer having a diameter in a range from 8 inches to 12 inches. The edge trimming apparatus 301 comprises a water jet track 312 which is a support structure that extends over and is coupled to the wafer platen 302. A water jet head 308 is coupled to and supported by the water jet track 312 such that the water jet head 308 overlaps the wafer platen 302 and is configured to move in a first (x-axis) direction along a length of the water jet track 312. The water jet track 312 is configured to move in a second (y-axis) direction and a third (z-axis) direction, and in this way the water jet head 308 can be moved over any location of the wafer 300. In addition, a height H1 between a bottommost point of the water jet head 308 and a top surface of the wafer 300 can be adjusted by moving the water jet track 312 in the third (z-axis) direction. The water jet track 312 supports a first inspection module 318A that is disposed over the wafer platen 302, the first inspection module 318A being configured to detect the height H1 between the water jet head 308 and the top surface of the wafer 300. In this way, the height H1 between the water jet head 308 and a top surface of the wafer 300 can then be adjusted as needed. The first inspection module 318A may be an ultrasonic ranging sensor that detects the height H1 between the water jet head 308 and the top surface of the wafer 300 by use of ultrasonic sound waves 319. In other embodiments, the first inspection module 318A detects the height H1 between the water jet head 308 and the top surface of the wafer 300 by emitting a laser beam vertically downwards towards the top surface of the wafer 300. In an embodiment, during a rotation of the wafer chuck 304 and the wafer 300, the laser beam of the first inspection module 318A can also be used to monitor the width W1 and shape of the removed portions from the outermost edges of the wafer 20 (described previously in FIG. 4). The water jet track 312 may also support a second inspection module 318B that is disposed adjacent to the wafer chuck 304, the second inspection module 318B being configured to detect a horizontal distance between the second inspection module 318B and an edge of the wafer 300. In this way, a correct positioning of the wafer 300 on the wafer chuck 304 before the edge trimming process 106 can be ensured. In an embodiment, the second inspection module 318B may be similar to the first inspection module 318A. For example, the second inspection module 318B may be an ultrasonic ranging sensor or may operate by emitting a laser beam. In an embodiment, during a rotation of the wafer chuck 304 and the wafer 300, the laser beam of the second inspection module 318B can also be used to monitor the trim depth and shape of the removed portions from the outermost edges of the wafer 20 (described previously in FIG. 4).

The water jet head 308 (which is described in detail in the subsequent Figures) is connected through one or more first tubes to an abrasive storage apparatus 316 (e.g., a tank). The abrasive storage apparatus 316 may be used to store one or more types of abrasives. A first pump may be used to transfer the one or more types of abrasives from the abrasive storage apparatus 316 to the water jet head 308 through the one or more first tubes. The water jet head 308 is also connected through one or more second tubes to a water source 314 (e.g., a tank). A second pump may be used to pump water from the water source 314 to the water jet head 308 through the one or more second tubes.

The edge trimming apparatus 301 may also comprise a removal module 306 (described in more detail in the subsequent Figures) that is disposed on the wafer platen 302 and adjacent to the wafer chuck 304. The removal module 306 is configured to move in the first (x-axis) direction, the second (y-axis) direction, and the third (z-axis) direction. The removal module comprises a thin wedge 307 that can be brought into contact with edges of the wafer 300 as the wafer 300 is rotated during the edge trimming process 106, in order to remove or extrude material from edges of the wafer 20.

Figure 6C:
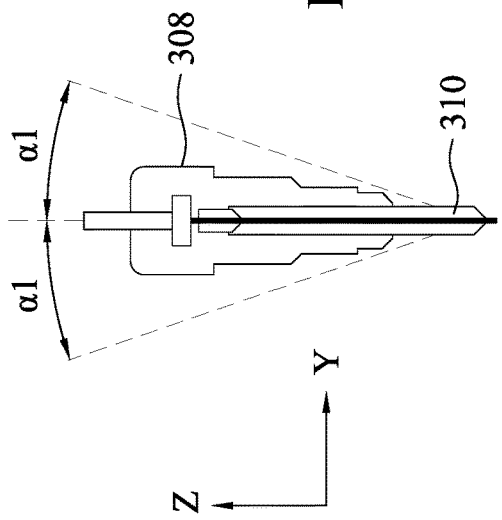
FIGS. 6A through 6C illustrate different views of a section of the wafer edge trimming apparatus, in accordance with some embodiments.
Figure 6B:
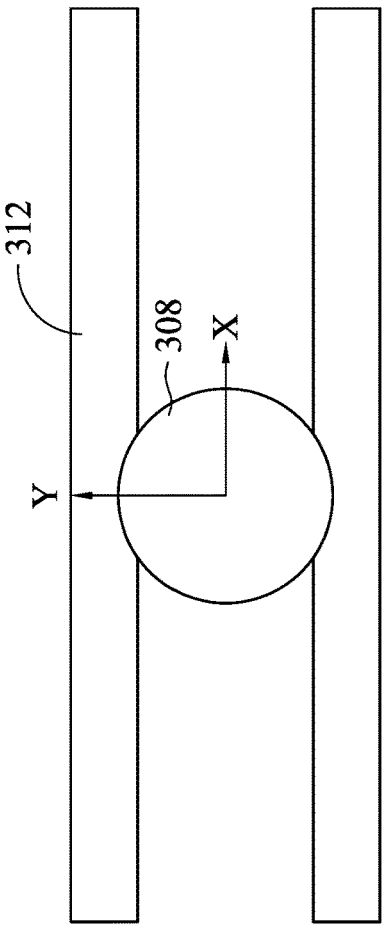
Figure 6A:
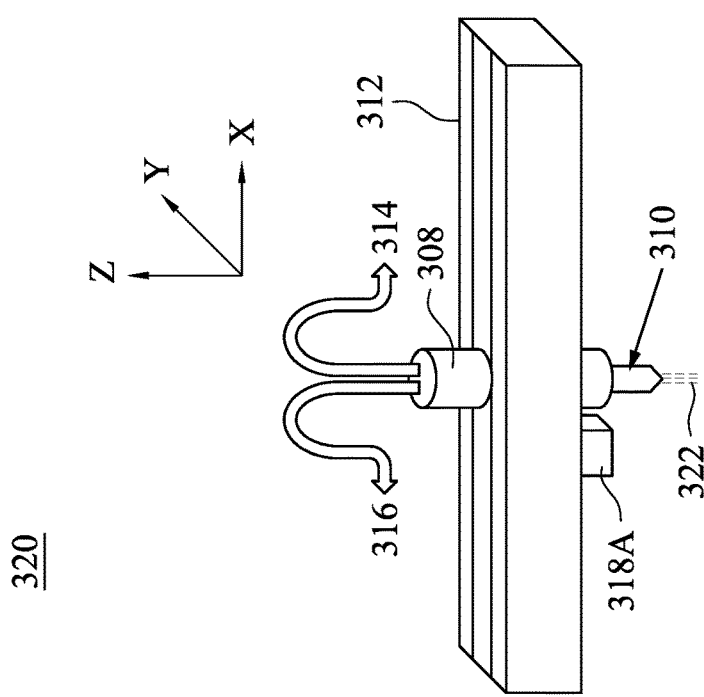

FIG. 6A illustrates a region 320 (shown in FIG. 5) of the edge trimming apparatus 301. The water jet head 308 also comprises an abrasive mixing tube 310 that is used to focus an abrasive-water mixture (in the form of a water jet 322) in a vertically downward direction as it exits the water jet head 308. The water jet head 308 is configured to move in the first (x-axis) direction along a length of the water jet track 312 (also shown in subsequent FIG. 6B). The water jet track 312 is configured to move in the second (y-axis) direction, and the third (z-axis) direction. In this way the water jet head 308 and therefore the water jet 322 can be focused on any desired location of the wafer 300. FIG. 6B illustrates a top-view of the water jet head 308 and the water jet track 312 that is shown in FIG. 6A. FIG. 6C illustrates the water jet head 308 and the abrasive mixing tube 310 in an embodiment where the water jet head 308 and the abrasive mixing tube 310 can be tilted in the second (y-axis) direction. Specifically, a center line that passes through the water jet head 308 and the abrasive mixing tube 310 forms an angle $\alpha 1$ with a vertical line that is parallel to the third (z-axis) direction. In an embodiment, the angle $\alpha 1$ is in a range from $-15°$ to $15°$. In this way, the water jet 322 can be propelled towards a top surface of the wafer 300 at a desired angle (e.g., a direction of movement of the water jet 322 is not necessarily orthogonal to the top surface of the wafer 300).

Figure 7B:
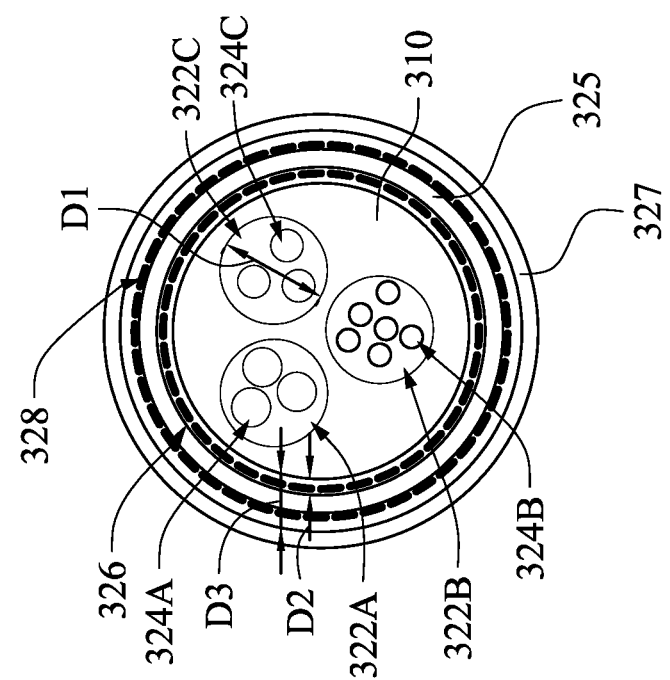
FIGS. 7A and 7B illustrate cross-sectional views of a water jet head, in accordance with some embodiments.
Figure 7A:
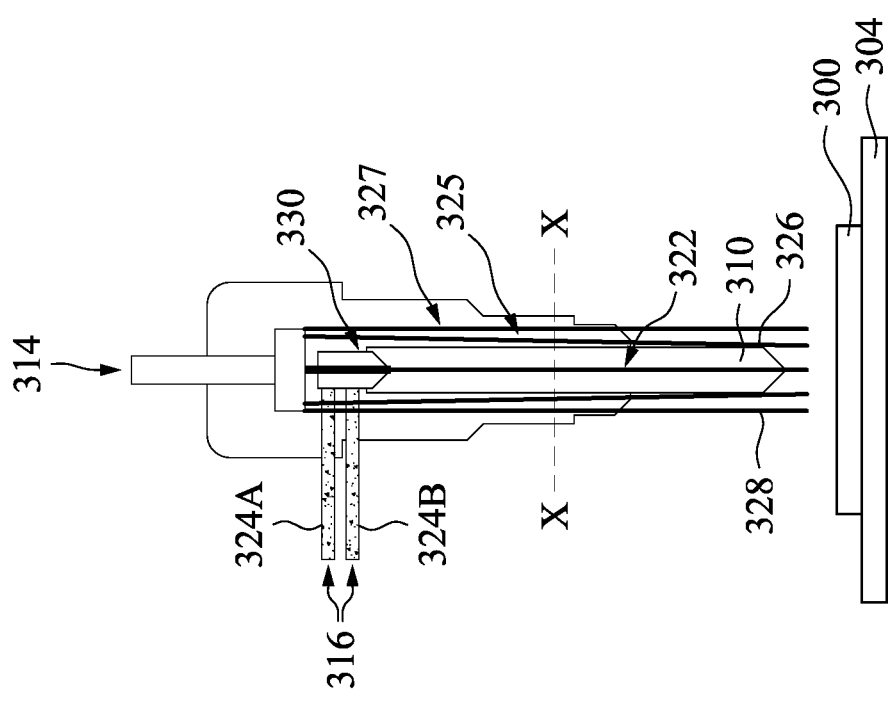

FIG. 7A illustrates a cross-sectional view of the water jet head 308, in accordance with an embodiment. FIG. 7B illustrates a cross-sectional view of the water jet head 308 along the line X-X shown in FIG. 7A. De-ionized water (DIW) from the water source 314 is forced through a nozzle 330 of the water jet head 308 under high pressure. One or more abrasives 324 from the abrasive storage apparatus 316 is also forced through the nozzle of the water jet head 308, where they are mixed with the de-ionized water in the nozzle 330 of the water jet head 308. The amount of each abrasive 324 forced through the water jet head 308 is controlled by a Computerized Numerical Control (CNC) machine. The nozzle 330 is used create a water jet 322 that moves in one direction at a high velocity, and the water jet 322 carries abrasive particles of the abrasive 324 as the water jet 322 goes through the abrasive mixing tube 310. The abrasive mixing tube 310 focuses the abrasive-water mixture (e.g., the water jet 322) in a vertically downward direction as it exits the water jet head 308 towards a top surface of the wafer chuck 304. The abrasive mixing tube 310 is also used to fully incorporate the abrasive particles of the abrasive 324 fully involved in the water stream of the water jet 322 and moving in the same direction.

In an embodiment, different types of abrasives 324 (e.g., abrasive 324A, abrasive 324B, and abrasive 324C) from the abrasive storage apparatus 316 can be forced through the water jet head 308, where they are mixed with the de-ionized water in the nozzle 330 of the water jet head 308. For example, the abrasive 324A, the abrasive 324B, and abrasive 324C may be different from each other, and a material of each of the abrasive 324A, the abrasive 324B, and the abrasive 324C may comprise silica, silicon dioxide, soda, steel grit, glass bead, aluminum oxide, silicon carbide, staurolite, garnet, copper, nickel, or zinc. In an embodiment, each of the abrasive 324A, the abrasive 324B, and the abrasive 324C may comprise abrasive particles, each of the abrasive particles (sometimes referred to as grit) having a diameter that is in a range from 10 nm to 500 nm. In an embodiment, the abrasive particles of the abrasive 324A have a different diameter from the abrasive particles of the abrasive 324B and the abrasive particles of the abrasive 324C, and the abrasive particles of the abrasive 324B have a different diameter from the abrasive particles of the abrasive 324A and the abrasive particles of the abrasive 324C. The nozzle 330 can therefore create a water jet 322 comprising abrasive particles from more than one abrasive 324 (e.g., any combination of the abrasive 324A, the abrasive 324B, and/or the abrasive 324C). The nozzle 330 can also be used to create a water jet 322 having only one of the different abrasives 324 as needed. For example, the nozzle 330 can be used to create a water jet 322A with only the abrasive 324A; the nozzle 330 can be used to create a water jet 322B with only the abrasive 324B; or the nozzle 330 can be used to create a water jet 322C with only the abrasive 324C.

In an embodiment, the water jet head 308 may comprise a plurality of nozzles 330. For example, a first nozzle 330 of the plurality of nozzles 330 can be used to create a water jet 322A comprising the abrasive 324A; a second nozzle 330 of the plurality of nozzles 330 can be used to create a water jet 322B comprising the abrasive 324B, and a third nozzle 330 the plurality of nozzles 330 can be used to create a water jet 322C comprising the abrasive 324C. In an embodiment, only a single water jet (e.g., the water jet 322A, the water jet 322B, or the water jet 322C) can be turned on at a single time. In an embodiment, more than one water jet (e.g., two or more of the water jet 322A, the water jet 322B, and the water jet 322C) can be turned on simultaneously. In an embodiment, the water jet 322 (e.g., each of the water jet 322A, the water jet 322B, or the water jet 322C) may have a diameter D1 that is in a range from 5 μm to 1000 μm. In an embodiment, during a cutting process to cut through hard materials (e.g., materials of the wafer 300) different water jets 322 (e.g., the water jet 322A, the water jet 322B, and the water jet 322C) can be turned on in any order, sequentially, to tune the cutting speed and depth of cut into the hard materials (e.g., the materials of the wafer 300). In this way, different portions of the cutting process can be performed using a combination of different water jets 322. For example, the water jet 322A can be used to form a first portion of a first crack 329 on an edge of the wafer 20, and the water jet 322B can be used to form a second portion of the first crack 329 on the edge of the wafer 20. Advantages can be achieved by having a water jet head that can be used to create different water jets each comprising a different abrasive. These advantages include the ability to tune the cutting speed of the water jet 322 as it cuts through the materials of the wafer 300.

The water jet 322 created by the nozzle 330 must have a high velocity to accelerate the abrasive particles of the abrasive 324 fast enough to cut through hard materials (e.g., materials of the wafer 300). To achieve this, in an embodiment, a pressure of the de-ionized water (DIW) of the water jet 322 may be in a range from 3000 Pa to 20000 Pa. In an embodiment, a first velocity of the de-ionized water (DIW) of the water jet 322 may be in a range from 100 to 1500 m/s.

Referring further to FIGS. 7A and 7B, the water jet head 308 may also comprise a water flow tube 325 that is disposed to be concentrically around the abrasive mixing tube 310, such that outermost sidewalls of the abrasive mixing tube 310 are disposed between inner sidewalls of the water flow tube 325. An inner sidewall of the water flow tube 325 is inclined such that a distance D2 between the inner sidewall of the water flow tube 325 and an adjacent outermost sidewall of the abrasive mixing tube 310 decreases in a direction moving from a topmost surface of the water jet head 308 towards the wafer 300. De-ionized water from the water source 314 (e.g., in the form of a water stream 326) may be flowed through spaces between the outermost sidewalls of the abrasive mixing tube 310 and inner sidewalls of the water flow tube 325. The water stream 326 may have a second velocity in a vertically downward direction towards a top surface of the wafer chuck 304 that is smaller than the first velocity of the water jet 322. Because the inner sidewall of the water flow tube 325 may be inclined (as described above), the water stream 326 can be propelled towards a top surface of the wafer 300 at an angle (e.g., a direction of movement of the water stream 326 is not orthogonal to the top surface of the wafer 300), such that lower portions of the water stream 326 are closer to the outermost sidewall of the abrasive mixing tube 310 than top portions of the water stream 326. In an embodiment lower portions of the abrasive mixing tube 310 are below bottommost surfaces of the water flow tube 325. The water stream 326 can be turned on during the edge trimming process 106 (described previously in FIG. 4). The water stream 326 flows around an outer perimeter of the water jet 322. For example, both the water stream 326 and the water jet 322 can be turned on simultaneously. Advantages can be achieved by having the water stream 326 flow around an outer perimeter of the water jet 322 and propelled towards a top surface of the wafer 300 at an angle. These advantages include the water stream 326 being able to flush away and better remove the abrasive 324 from surfaces of the wafer 300 during the edge trimming process 106.

The water jet head 308 may also comprise an air flow tube 327 that is disposed to be concentrically around the water flow tube 325 and the abrasive mixing tube 310, such that outermost sidewalls of the abrasive mixing tube 310 and the water flow tube 325 are disposed between inner sidewalls of the air flow tube 327. An inner sidewall of the air flow tube 327 is inclined such that a distance D3 between the inner sidewall of the air flow tube 327 and an adjacent outermost sidewall of the abrasive mixing tube 310 decreases in a direction moving from a topmost surface of the water jet head 308 towards the wafer 300. Air can be pumped to flow (e.g., in the form of an air stream 328) through spaces between the outermost sidewalls of the water flow tube 325 and inner sidewalls of the air flow tube 327. The air stream 328 may flow in a vertically downward direction towards a top surface of the wafer chuck 304. Because the inner sidewall of the air flow tube 327 may be inclined (as described above) the air stream 328 can flow in an inclined manner, such that lower portions of the air stream 328 are closer to the outermost sidewall of the abrasive mixing tube 310 than top portions of the air stream 328. The air stream 328 can be turned on during the edge trimming process 106. The air stream 328 flows around outer perimeters of the water jet 322 and the water stream 326. For example, the water stream 326, the water jet 322, and air stream 328 can be turned on simultaneously. Advantages can be achieved by having the air stream 328 flow around outer perimeters of the water jet 322 and the water stream 326. In addition, the air stream 328 flows in an inclined manner, such that lower portions of the air stream 328 are closer to the outermost sidewall of the abrasive mixing tube 310 than top portions of the air stream 328. These advantages include the air stream 328 being able to flush away and better remove the abrasive 324 from surfaces of the wafer 300 during the edge trimming process 106. In addition, the use of both the water stream 326 and the air stream 328 during the edge trimming process 106 increases cleaning effectiveness and decreases the number of particles present after the edge trimming process 106.

Figure 8B:
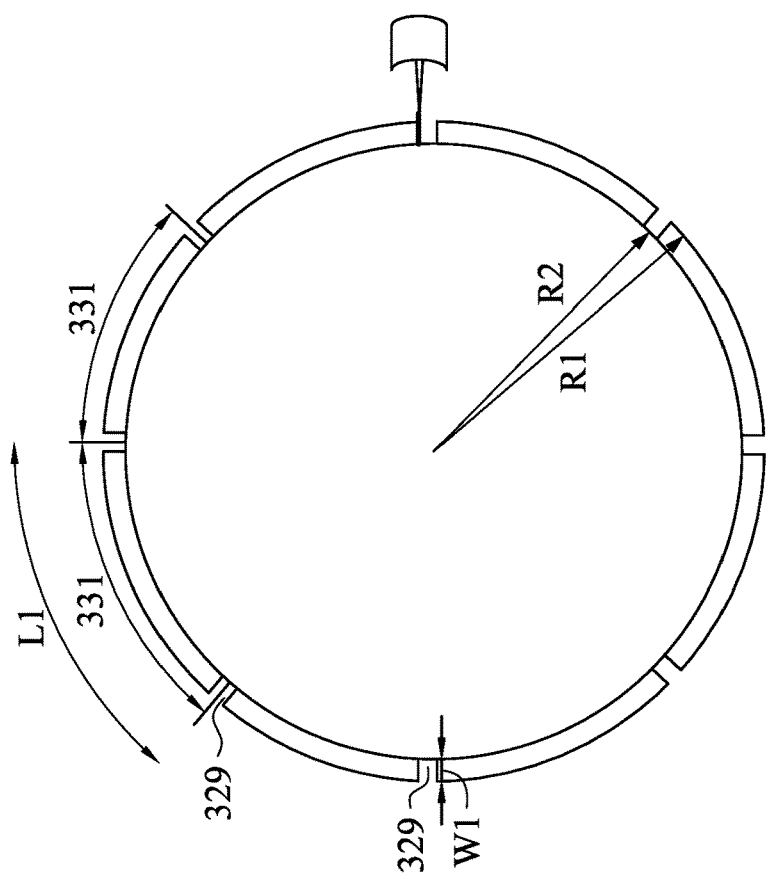
FIGS. 8A and 8B illustrate a cross-sectional view and a top-down view of an intermediate step during a wafer edge trimming process, in accordance with some embodiments.
Figure 8A:
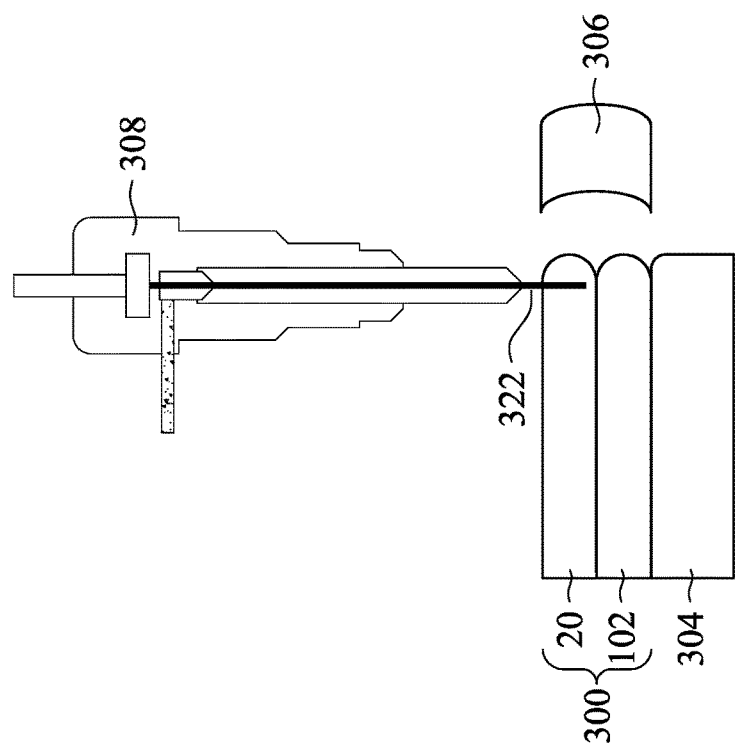

FIGS. 8A through 10C illustrate particular details of the edge trimming process 106 described previously in FIG. 4. The edge trimming process is performed using the edge trimming apparatus 301 described previously in FIGS. 5 through 7B. In FIGS. 8A and 8B, a first process 108 of the edge trimming process 106 is performed. FIG. 8B illustrates a top-view of the wafer 20. In the first process 108, the water jet head 308 is used to direct the water jet 322 to form cracks 329 on edges of the wafer 20. Each crack 329 extends completely through an edge of the wafer 20. The cracks 329 may also be referred to subsequently as notches. During the first process 108, the water stream 326, the water jet 322, and the air stream 328 may be turned on simultaneously. In an embodiment, during the first process 108, the water stream 326, and one of the water jet 322 or the air stream 328 may be turned on simultaneously. In an embodiment, during the first process 108, only the water jet 322 may be turned on. The cracks 329 are formed at uniform intervals along the edges or perimeter of the wafer 20, such that the outer perimeter of the wafer 20 comprises a plurality of edge sections 331. Each edge section 331 is a region on the outer perimeter of the wafer 20 that is disposed between two adjacent cracks 329. Each edge section 331 has a uniform length L1 along the circumference of the wafer 20. In an embodiment, after the first process 108, the wafer 20 may comprise a total number of edge sections 331 that are in a range from 4 to 360. Each crack 329 may extend laterally into the edge of the wafer 20 by a distance equal to the width W1. The W1 is the width of the removed portion around the entire perimeter of the wafer 20 after the edge trimming process 106 is performed. After the first process 108 is performed, a distance from the center of the wafer 20 to outermost edges of the wafer 20 may be equal to the radius R1, and a distance from the center of the wafer 20 to innermost edges of the wafer 20 (e.g., at an inner edge of the crack 329) may be equal to the radius R2. In an embodiment, during the first process 108, cracks 329 may be formed to also extend through top regions of the carrier substrate 102. In this way, each crack 329 may extend vertically through both the wafer 20 and a top region of the carrier substrate 102 that is below the wafer 20. Advantages can be achieved by forming the cracks 329 during the first process 108. These advantages include reducing uncontrolled cracking and peeling at the edges of the wafer 20 during a subsequent second process 110 (shown subsequently in FIGS. 9A and 9B). The uncontrolled cracking and peeling may be as a result of long trim distances at the edges of the wafer 20.

Figure 10A:
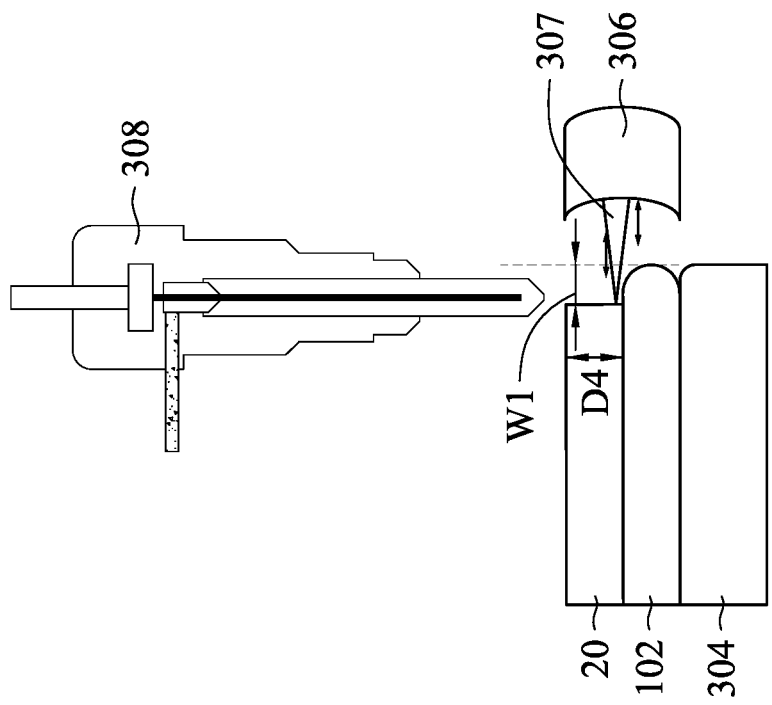
Figure 9C:
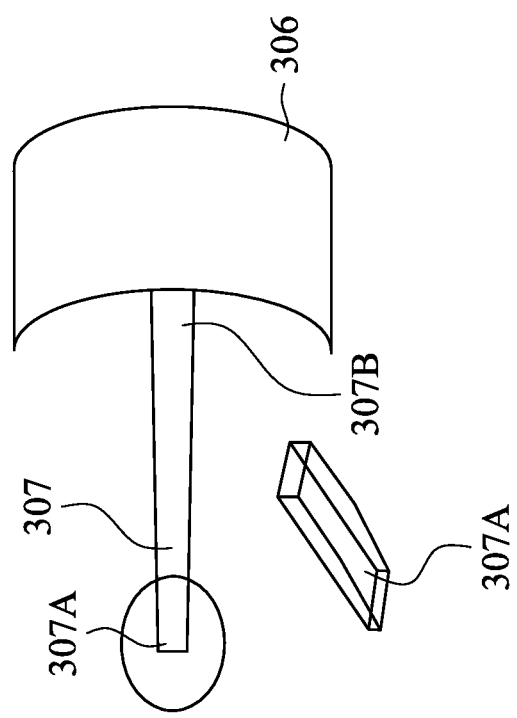
FIG. 9C illustrates different views of a wafer edge removal module, in accordance with some embodiments.
Figure 10C:
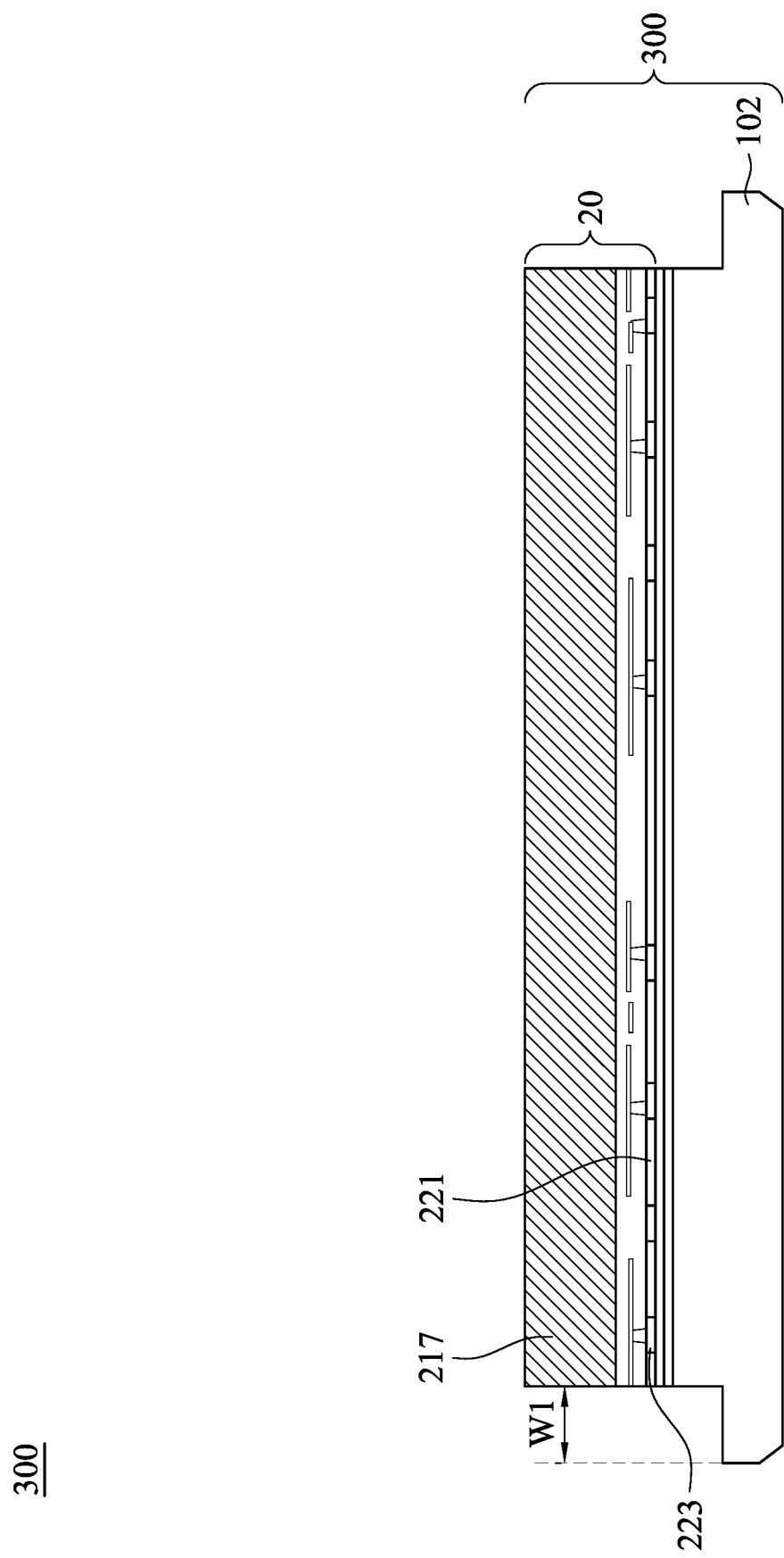

FIGS. 9A and 9B show a second process 110 of the edge trimming process 106 being performed. FIGS. 10A, 10B and 10C show the wafer 20 after the second process 110 is performed. FIGS. 9B and 10B illustrate top-view of the wafer 20. The removal module 306 (shown in FIGS. 9A through 9C) is disposed on the wafer platen 302 and adjacent to the wafer chuck 304. The removal module 306 is configured to move in the first (x-axis) direction, the second (y-axis) direction, and the third (z-axis) direction. The removal module 306 comprises a thin wedge 307 (shown in FIG. 9C), which is a block of material that comprises a thick end 307B which tapers over a length to a thin edge 307A. The thin wedge 307 may comprise a material such as stainless steel, aluminum, ceramic, engineering plastics (polyvinyl alcohol (PVA), polypropylene (PP), etc.), silica, silicon dioxide, aluminum oxide, silicon carbide, or the like. During the second process 110, the removal module 306 can be brought into contact with edges of the wafer 300, with the thin edge 307A of the thin wedge 307 being inserted into a first crack 329 on the edge of the wafer 20. Additionally, when the first crack 329 extends vertically through both the wafer 20 and a top region of the carrier substrate 102 that is below the wafer 20, the removal module 306 can be also brought into contact with edges of the carrier substrate 102, with the thin edge 307A of the thin wedge 307 also being inserted into the first crack 329 on the edge of the carrier substrate 102. The wafer chuck 304 is then rotated to rotate the wafer 300 (and to consequently rotate the wafer 20). The thin wedge 307 expands the first crack 329 and removes or extrudes material from the edges of the wafer 20 as the wafer 300 is rotated. Additionally, when the first crack 329 extends vertically through both the wafer 20 and the top region of the carrier substrate 102, the thin wedge 307 removes or extrudes material from the edges of the top region of the carrier substrate 102 as the wafer 300 is rotated. The presence of the first crack 329 makes it easier for the thin wedge 307 to remove or extrude material from the edges of the wafer 20.

The wafer 300 is rotated until a first edge section 331 on the outer perimeter of the wafer 20 is removed. The wafer 300 (and consequently the wafer 20) is then rotated again, and the thin wedge 307 continues to remove or extrude material from the edges of the wafer 20 as the wafer 300 is rotated. The wafer 300 is rotated until a second edge section 331 on the outer perimeter of the wafer 20 is removed. The rotation of the wafer 300 is repeated, until all edge sections 331 on the outer perimeter of the wafer 20 are removed. For example, the wafer 300 may be rotated by 360° such that edge portions of the wafer 20 having the desired width W1 (shown in FIGS. 10A, 10B, and 10C) are removed from outermost edges of the wafer 20. During the second process 110, a depth D4 of the removed or extruded material from the edges of the wafer 20 is monitored using a charged-coupled device (CCD) camera 309. The CCD camera 309 is mounted on the removal module 306. In addition, during the second process 110, a fluid (e.g., water, or the like) or atomizing flow may be dispensed through the removal module 306 to assist with the removal or extrusion of material from the edges of the wafer 20. Advantages can be achieved by inserting the thin wedge 307 into the first crack 329, and then rotating the wafer 300 in order to expand the first crack 329 and remove or extrude material from the edges of the wafer 20. These advantages include eliminating thermal damage (e.g., if a laser trimming process was used instead) to the wafer 20. In addition, blade wear is eliminated (e.g., if a blade trimming process was used instead) and blade maintenance requirements (e.g., blade dressing) are also eliminated. As a result, the use of the edge trimming process 106 allows edge trimming operations to be performed at a faster rate with lower maintenance requirements, and this therefore increases the wafer per hour (WPH) processing rate.

Figure 11:
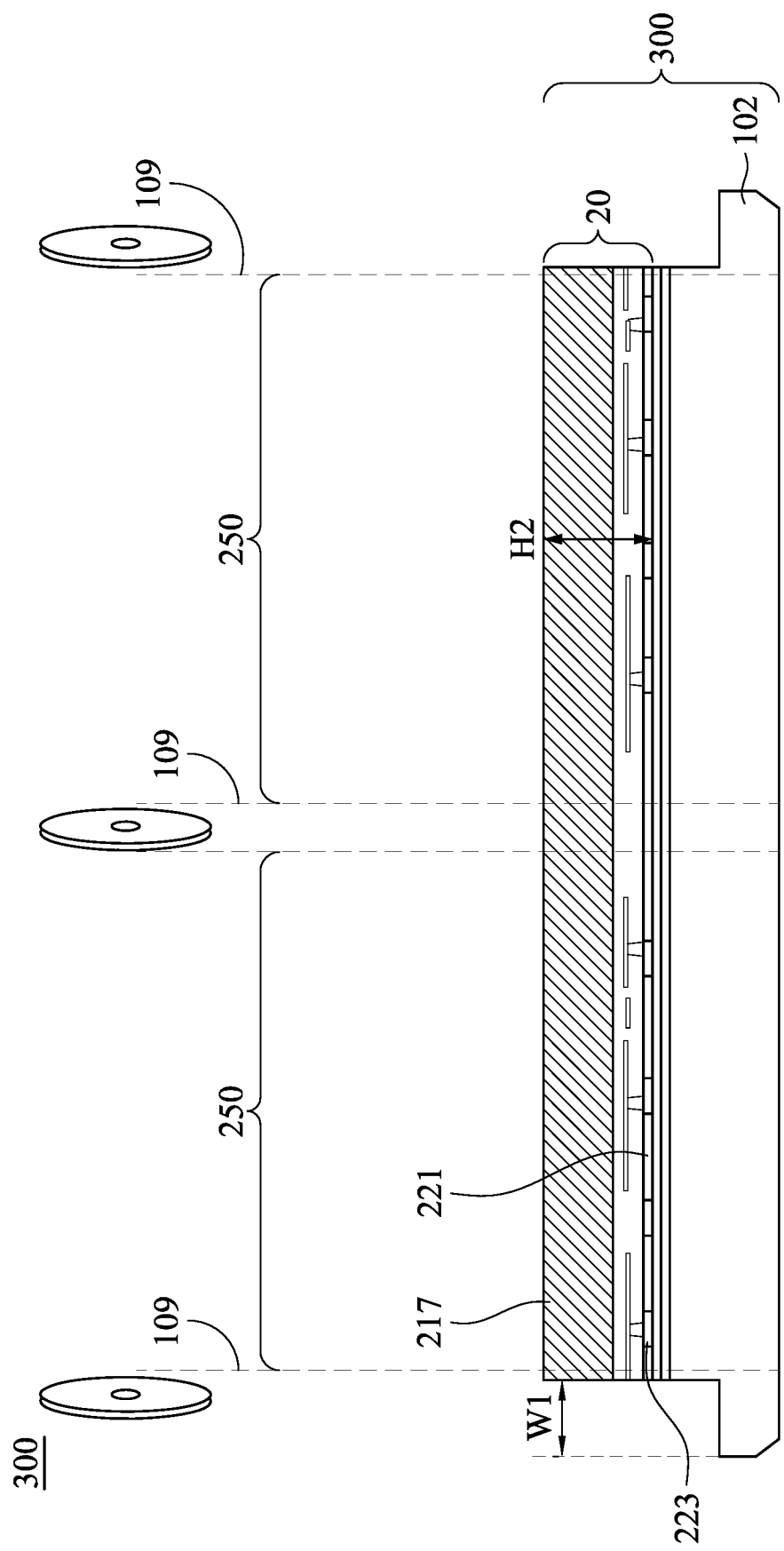
FIGS. 11 and 12 illustrate cross-sectional views of intermediate steps during a process for singulating semiconductor dies from a wafer, in accordance with some embodiments.

In FIG. 11, a thinning process is performed on a back surface of the wafer 20 to reduce a thickness of the substrate 217. For example, the thinning process may include planarizing a surface of the substrate 217 using CMP, grinding, or the like. The thinning process shown and described in FIG. 11 may be omitted if the optional thinning process shown and described previously in the alternate embodiment of FIG. 3B has been performed. In an embodiment, after the thinning process, further processes may be performed on the back surface of the wafer 20 to form other structures such as insulating layers, metallization layers, contact pads, or the like (not shown in the Figures). In an embodiment, after the thinning process, a singulation process is performed on the wafer 20 to singulate individual semiconductor dies 250 of the wafer 20 from one another as shown subsequently in FIG. 12. In an embodiment, after the thinning process, a height H2 of the wafer 20 is smaller than 100 um. In alternate embodiments, the thinning process may be performed prior to performing the edge trimming process 106 (described previously in FIG. 4). Advantages can be achieved by performing the edge trimming process 106 prior to the thinning process of FIG. 11 and the singulation process described subsequently in FIG. 12. The edge trimming process 106 removes bevels (e.g., the lower bevels 231 and the upper bevels 233) from the wafer 20 and forms the vertical sidewalls 225 around the entire periphery of the wafer 20. Performing the edge trimming process 106 to form the vertical sidewalls 225 prevents the edge of the wafer 20 being unacceptably thin, sharp, and fragile during the thinning process, thereby reducing the risk of edge cracks in the wafer 20.

Figure 12:
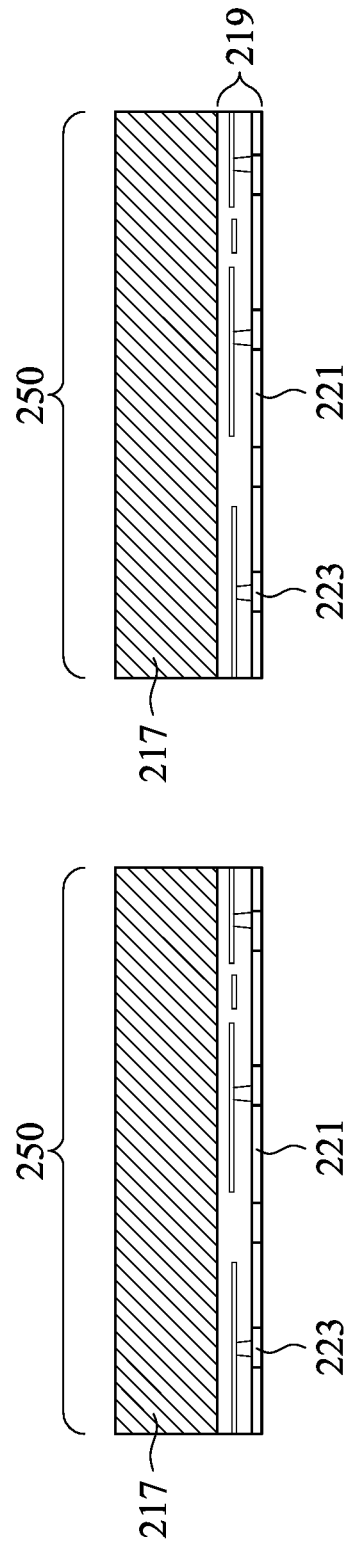

In FIG. 12, the carrier substrate 102 is detached or removed from the wafer 20. In accordance with some embodiments, the carrier substrate 102, the bonding layer 104A, and the bonding layer 104B are removed using a planarization process (e.g., a CMP or grinding process), or the like. After the planarization process, the bonding pads 223 and the bonding layer 221 of the wafer 20 are exposed. In an alternate embodiment, the removal of the carrier substrate 102 from the wafer 20 includes projecting a light such as a laser light or an UV light on bonding layers 104A/104B so that the bonding layers 104A/104B decompose under the heat of the light and the carrier substrate 102 can be removed.

After the removal of the carrier substrate 102 from the wafer 20, the singulation process is performed on the wafer 20 to singulate individual semiconductor dies 250 of the wafer 20 from one another. The singulation process may include a mechanical process such as a sawing process, a cutting process, or the like. In some embodiments, the singulation process may include a lasering process, mechanical process, and/or combinations thereof. The singulation is performed along the scribe line regions 109 (shown in FIG. 11) through the interconnect structure 219, and the substrate 217 of the wafer 20. In an alternate embodiment, the water jet 322 of the edge trimming apparatus 301 (described previously in FIGS. 5 through 7B) may be used to perform the singulation process on the wafer 20 to singulate individual semiconductor dies 250 of the wafer 20 from one another.

Each of the FIGS. 13A through 13D illustrate alternative embodiments that describe alternate methods of performing the first process 108 of the edge trimming process 106 (described previously in FIGS. 4, 8A, and 8B). Unless specified otherwise, like reference numerals in these embodiment (and subsequently discussed embodiments) represent like components in the embodiment shown in FIGS. 1 through 12 formed by like processes. Accordingly, the process steps and applicable materials may not be repeated herein. In FIGS. 13A through 13D, the first processes 108 is performed without a carrier substrate 102 attached to the wafer 20 300. Instead, the wafer 20 is directly attached to the wafer chuck 304 using an adhesive tape 332 that is disposed on the wafer chuck 304. During the first process 108 of FIGS. 13A through 13D, each crack 329 that is formed extends completely through an edge of the wafer 20. Advantages can be achieved by using the adhesive tape 332 to attach the wafer 20 to the wafer chuck 304. These include the adhesive tape 332 preventing damage to the wafer chuck 304 from the water jet 322 during the first process 108.

Figure 13C:
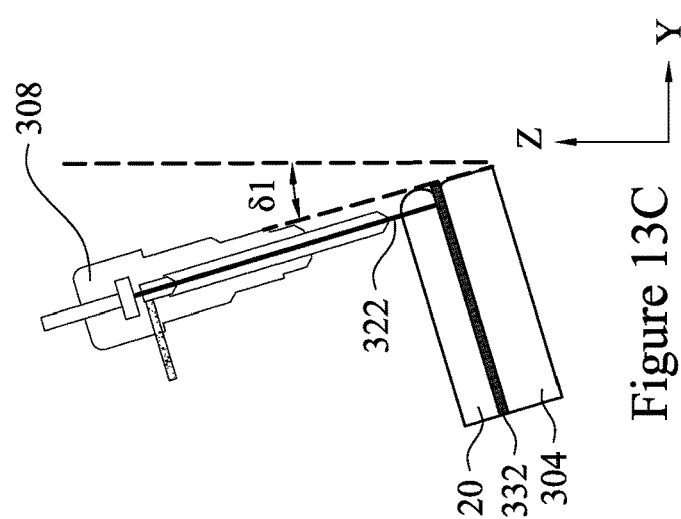
FIGS. 13A through 13D illustrate cross-sectional views of intermediate steps during a wafer edge trimming process, in accordance with other embodiments.
Figure 13B:
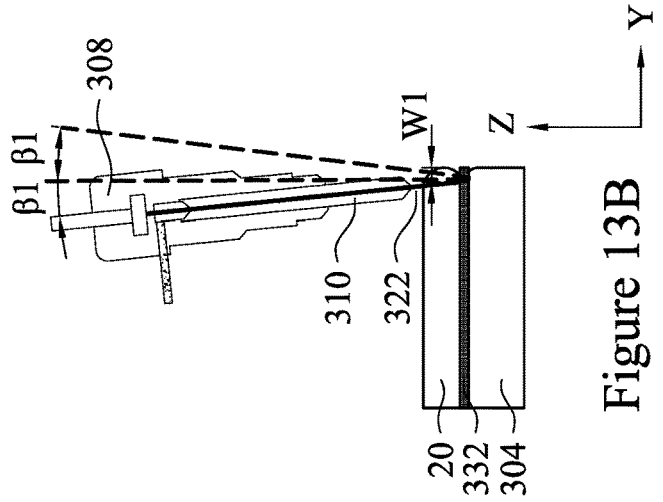
Figure 13A:
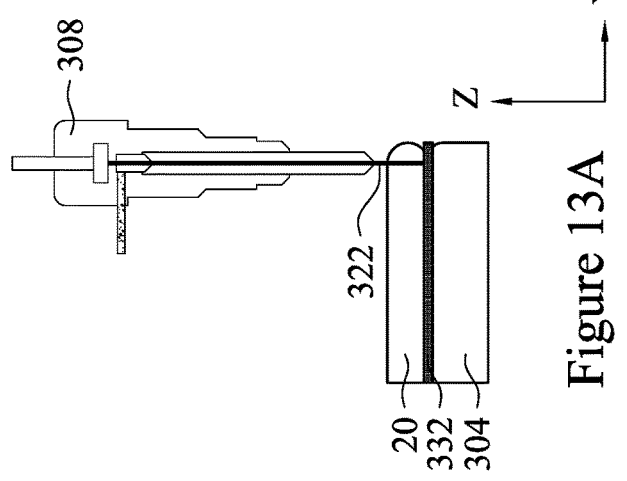

In the embodiment of FIG. 13B, during the first process 108, the water jet head 308 and the abrasive mixing tube 310 can be tilted in the second (y-axis) direction such that a center line that passes through the water jet head 308 and the abrasive mixing tube 310 forms an angle β1 with a vertical line that is parallel to the third (z-axis) direction. In an embodiment, the angle β1 is in a range from −15° to 15°. The water jet 322 from the water jet head 308 can therefore be propelled towards a top surface of the wafer 20 at an angle (e.g., a direction of movement of the water jet 322 is not orthogonal to the top surface of the wafer 20). Advantages can be achieved by tilting the water jet head 308 and abrasive mixing tube 310 to form the angle β1 with a vertical line that is parallel to the third (z-axis) direction. These advantages include being able to form each crack 329 with an inclined inner sidewall, such that the width W1 between the inner sidewall of the crack 329 and an outermost edge of the wafer 20 decreases or increases in a direction moving from a topmost surface of the wafer 20 towards the wafer chuck 304.

The embodiment of FIG. 13C illustrates that during the first process 108, the water jet head 308 and the abrasive mixing tube 310 is tilted in the second (y-axis) direction (as described in FIG. 13B) such that a center line that passes through the water jet head 308 and the abrasive mixing tube 310 forms the angle β1 with a vertical line that is parallel to the third (z-axis) direction. In addition, the wafer chuck 304 is also tilted in the second (y-axis) direction such that a sidewall of an edge of the wafer chuck 304 forms an angle δ1 with a vertical line that is parallel to the third (z-axis) direction. In an embodiment, the angle δ1 is the same as the angle β1. In an embodiment, the angle δ1 is not equal to the angle β1. In an embodiment where the angle δ1 is the same as the angle β1, the water jet 322 from the water jet head 308 can be propelled towards a top surface of the wafer 20 orthogonally (e.g., a direction of movement of the water jet 322 is at a right angle to the top surface of the wafer 20). Advantages can be achieved by tilting the water jet head 308 and abrasive mixing tube 310 to form the angle β1 with a vertical line that is parallel to the third (z-axis) direction. In addition, the wafer chuck 304 is also tilted in the second (y-axis) direction such that a sidewall of an edge of the wafer chuck 304 forms the angle δ1 with a vertical line that is parallel to the third (z-axis) direction. These advantages include the use of different wafer chuck 304 tilt angles δ1, to allow for better cutting of the wafer 20 by the water jet 322 when forming the cracks 329. In addition, the tilted wafer chuck 304 helps to prevent the abrasive 324 from accumulating on a sloping top surface of the wafer chuck 304 by allowing it to flow down and off the sloping top surface with the aid of gravity. Further, when the angle δ1 of the wafer chuck 304 is the same as the angle β1 of the water jet head 308, the water jet 322 from the water jet head 308 can be propelled towards a top surface of the wafer 20 orthogonally (e.g., a direction of movement of the water jet 322 is at a right angle to the top surface of the wafer 20).

Figure 13D:
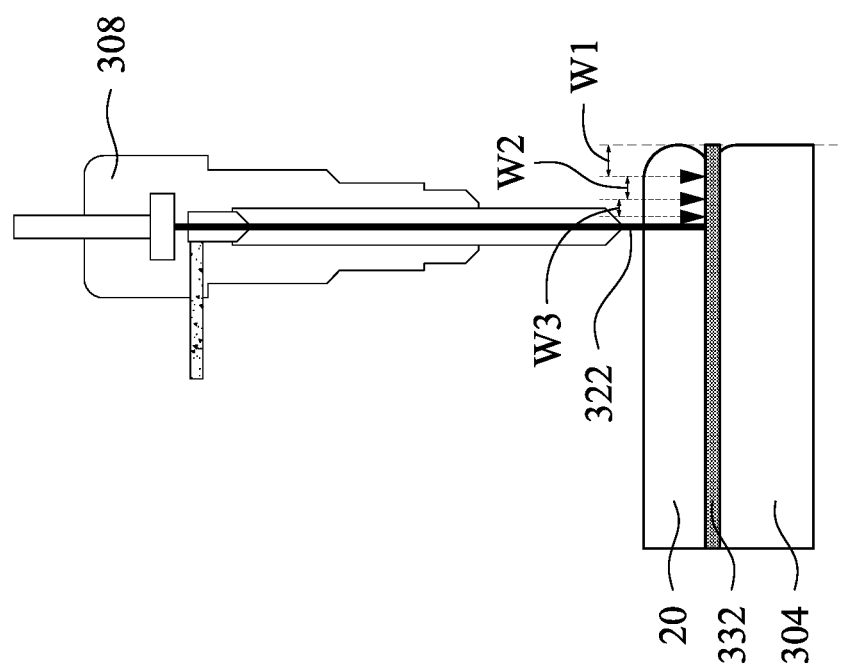

FIG. 13D illustrates an embodiment in which the edge trimming process 106 is performed at least two times in a cyclic manner (e.g., each cycle comprising the first process 108 being performed, followed by the second process 110 being performed sequentially after the first process 108 is performed). Any number of cycles of the edge trimming process 106 may be performed. The first cycle of the edge trimming process 106 comprises performing the first process 108, in which the water jet head 308 is used to direct the water jet 322 to form cracks 329 on edges of the wafer 20 in a similar manner as was described previously in FIGS. 8A and 8B. Each crack 329 may extend laterally into the edge of the wafer 20 by a distance equal to the width W1. The second process 110 of the edge trimming process 106 is then performed, in which the removal module 306 can be brought into contact with edges of the wafer 20, with the thin edge 307A of the thin wedge 307 being inserted into the first crack 329 on the edge of the wafer 20. The wafer chuck 304 is then rotated to rotate the wafer 20, and the thin wedge 307 expands the first crack 329 and removes or extrudes material from the edges of the wafer 20 as the wafer 20 is rotated. The rotation of the wafer 20 continues in the manner described previously in FIGS. 9A and 9B, such that edge portions of the wafer 20 having the desired width W1 are removed from outermost edges of the wafer 20 to form what can be referred to subsequently as a trimmed wafer 20.

After the first cycle of the edge trimming process 106 is completed, a second cycle of the edge trimming process 106 is performed on the trimmed wafer 20. The second cycle of the edge trimming process 106 is similar to the first cycle of the edge trimming process 106. During the second cycle of the edge trimming process 106, a first process 108 is performed in which cracks 329 are formed on edges of the trimmed wafer 20 in a similar manner as was described above for the first cycle of the edge trimming process 106. Each crack 329 may extend laterally into the edge of the trimmed wafer 20 by a distance equal to the width W2. The width W2 may be equal to or not equal to the width W1. The second process 110 of the second cycle of the edge trimming process 106 is then performed in a manner that was described above for the first cycle of the edge trimming process 106. In this way, during the second process 110 of the second cycle of the edge trimming process 106, edge portions of the wafer 20 having the desired width W2 are removed from outermost edges of the trimmed wafer 20. After the second cycle of the edge trimming process 106 is performed, any number of further cycles of the edge trimming process 106 may be performed (e.g., to remove further edge portions of the wafer 20 having the desired width W3 from outermost edges of the wafer 20).

The embodiments of the present disclosure have some advantageous features. The embodiments provide methods applied to trimming the edges of a first wafer (e.g., a device wafer) that comprises a number of semiconductor dies. The first wafer is bonded to a carrier wafer to form a second wafer. An edge trimming process is performed on the second wafer using a wafer trimming apparatus to trim edges of the first wafer. The edge trimming process comprises using a water jet having one or more mixed-in abrasives to cut through materials of the first wafer. As a result, thermal damage to the first wafer can be eliminated. In addition, blade wear and blade maintenance requirements are also eliminated. As a result, the use of the wafer trimming apparatus allows edge trimming operations to be performed at a faster rate with lower maintenance requirements, and this therefore increases the wafer per hour (WPH) processing rate.

In accordance with an embodiment, a method of trimming a wafer includes securing the wafer on a top surface of a wafer chuck of a wafer edge trimming apparatus; directing a water jet at an edge of the wafer to form a plurality of cracks at uniform intervals along the edge of the wafer; inserting a wedge of a removal module into a first crack of the plurality of cracks; and rotating the wafer, where during the rotation of the wafer, the wedge expands the first crack of the plurality of cracks and removes material from the edge of the wafer. In an embodiment, directing the water jet at the edge of the wafer to form the plurality of cracks includes focusing an abrasive-water mixture at the edge of the wafer using a water jet head, the water jet head being configured to move over the wafer. In an embodiment, a pressure of water in the water jet is in a range from 3000 Pa to 20000 Pa. In an embodiment, the abrasive-water mixture includes abrasive particles, where each of the abrasive particles has a diameter that is in a range from 10 nm to 500 nm. In an embodiment, the abrasive particles include silica, silicon dioxide, soda, steel grit, glass bead, aluminum oxide, silicon carbide, staurolite, garnet, copper, nickel, or zinc. In an embodiment, the wedge includes stainless steel, aluminum, ceramic, silica, silicon dioxide, aluminum oxide, or silicon carbide. In an embodiment, securing the wafer on the top surface of the wafer chuck includes attaching the wafer to the top surface of the wafer chuck using an adhesive tape.

In accordance with an embodiment, a method includes performing an edge trimming process to remove material from edges of a wafer, where performing the edge trimming process includes securing the wafer on a wafer chuck of an edge trimming apparatus; forming a plurality of cracks that extend laterally into the edges of the wafer, the plurality of cracks being disposed at uniform intervals along the edges of the wafer, where forming the plurality of cracks includes directing a first water jet to form a first portion of a first crack of the plurality of cracks at an edge of the wafer; and directing a second water jet to form a second portion of the first crack of the plurality of cracks at the edge of the wafer; inserting a thin wedge into the first crack of the plurality of cracks; and rotating the wafer to remove the material from the edges of the wafer. In an embodiment, the first water jet includes a first abrasive-water mixture that includes a first abrasive, where the second water jet includes a second abrasive-water mixture that includes a second abrasive, and where a material of the first abrasive is different from a material of the second abrasive. In an embodiment, the first abrasive includes first abrasive particles, each of the first abrasive particles having a first diameter, where the second abrasive includes second abrasive particles, each of the second abrasive particles having a second diameter, and where the first diameter is different from the second diameter. In an embodiment, directing the first water jet to form the first portion of the first crack of the plurality of cracks includes passing water through a nozzle in a water jet head under high pressure to create the first water jet; and focusing the first water jet towards the edge of the wafer using an abrasive mixing tube of the water jet head, where the abrasive mixing tube is disposed below the nozzle. In an embodiment, during directing the first water jet to form the first portion of the first crack of the plurality of cracks, the water jet head and the abrasive mixing tube are tilted such that a center line that passes through the water jet head and the abrasive mixing tube forms a first angle with a vertical line that is orthogonal to a top surface of the wafer chuck, and where the first angle is in a range from −15° to 15°. In an embodiment, each of the first water jet and the second water jet has a diameter that is in a range from 5 µm to 1000 µm.

In accordance with an embodiment, a wafer edge trimming apparatus includes a wafer chuck having a top surface to support a wafer; a water jet track extending over the wafer chuck; a water jet head coupled to the water jet track, the water jet head being configured to be disposed over the wafer, the water jet head being configured to create a water jet that is focused towards the top surface of the wafer chuck; and an edge removal module adjacent to the wafer chuck, the edge removal module being configured to contact edges of the wafer. In an embodiment, the edge removal module includes a wedge configured to remove material from the edges of the wafer, and where the wedge includes stainless steel, aluminum, ceramic, silica, silicon dioxide, aluminum oxide, or silicon carbide. In an embodiment, the wafer edge trimming apparatus further includes an abrasive storage apparatus used to store a first abrasive; and a water source to provide water, where the water jet includes the first abrasive mixed with water from the water source. In an embodiment, a first velocity of the water jet is in a range from 100 to 1500 m/s. In an embodiment, the first abrasive includes abrasive particles, where each of the abrasive particles has a diameter that is in a range from 10 nm to 500 nm. In an embodiment, the water jet head includes an abrasive mixing tube used to focus the water jet; a water flow tube disposed to be concentrically around the abrasive mixing tube; and an air flow tube disposed to be concentrically around the water flow tube and the abrasive mixing tube. In an embodiment, the water flow tube is configured to direct water from the water source towards the top surface of the wafer chuck, where the water flows around an outer perimeter of the water jet.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method of trimming a wafer, the method comprising:
   securing the wafer on a top surface of a wafer chuck of a wafer edge trimming apparatus;
   directing a water jet at an edge of the wafer to form a plurality of cracks at uniform intervals along the edge of the wafer;
   inserting a wedge of a removal module into a first crack of the plurality of cracks; and
   rotating the wafer, wherein during the rotation of the wafer, the wedge expands the first crack of the plurality of cracks and removes material from the edge of the wafer.

2. The method of claim 1, wherein directing the water jet at the edge of the wafer to form the plurality of cracks comprises:

focusing an abrasive-water mixture at the edge of the wafer using a water jet head, the water jet head being configured to move over the wafer.

3. The method of claim 2, wherein a pressure of water in the water jet is in a range from 3000 Pa to 20000 Pa.

4. The method of claim 2, wherein the abrasive-water mixture comprises abrasive particles, wherein each of the abrasive particles has a diameter that is in a range from 10 nm to 500 nm.

5. The method of claim 4, wherein the abrasive particles comprise silica, silicon dioxide, soda, steel grit, glass bead, aluminum oxide, silicon carbide, staurolite, garnet, copper, nickel, or zinc.

6. The method of claim 1, wherein the wedge comprises stainless steel, aluminum, ceramic, silica, silicon dioxide, aluminum oxide, or silicon carbide.

7. The method of claim 1, wherein securing the wafer on the top surface of the wafer chuck comprises attaching the wafer to the top surface of the wafer chuck using an adhesive tape.

8. A method comprising:
    performing an edge trimming process to remove material from edges of a wafer, wherein performing the edge trimming process comprises:
        securing the wafer on a wafer chuck of an edge trimming apparatus;
        forming a plurality of cracks that extend laterally into the edges of the wafer, the plurality of cracks being disposed at uniform intervals along the edges of the wafer, wherein forming the plurality of cracks comprises:
            directing a first water jet to form a first portion of a first crack of the plurality of cracks at an edge of the wafer; and
            directing a second water jet to form a second portion of the first crack of the plurality of cracks at the edge of the wafer;
        inserting a thin wedge into the first crack of the plurality of cracks; and
        rotating the wafer to remove the material from the edges of the wafer.

9. The method of claim 8, wherein the first water jet comprises a first abrasive-water mixture that includes a first abrasive, wherein the second water jet comprises a second abrasive-water mixture that includes a second abrasive, and wherein a material of the first abrasive is different from a material of the second abrasive.

10. The method of claim 9, wherein the first abrasive comprises first abrasive particles, each of the first abrasive particles having a first diameter, wherein the second abrasive comprises second abrasive particles, each of the second abrasive particles having a second diameter, and wherein the first diameter is different from the second diameter.

11. The method of claim 8, wherein directing the first water jet to form the first portion of the first crack of the plurality of cracks comprises:
    passing water through a nozzle in a water jet head under high pressure to create the first water jet; and
    focusing the first water jet towards the edge of the wafer using an abrasive mixing tube of the water jet head, wherein the abrasive mixing tube is disposed below the nozzle.

12. The method of claim 11, wherein during directing the first water jet to form the first portion of the first crack of the plurality of cracks, the water jet head and the abrasive mixing tube are tilted such that a center line that passes through the water jet head and the abrasive mixing tube forms a first angle with a vertical line that is orthogonal to a top surface of the wafer chuck, and wherein the first angle is in a range from −15° to 15°.

13. The method of claim 12, wherein each of the first water jet and the second water jet has a diameter that is in a range from 5 µm to 1000 µm.

14. A wafer edge trimming apparatus comprising:
    a wafer chuck having a top surface to support a wafer;
    a water jet track extending over the wafer chuck;
    a water jet head coupled to the water jet track, the water jet head being configured to be disposed over the wafer, the water jet head being configured to create a water jet that is focused towards the top surface of the wafer chuck; and
    an edge removal module adjacent to the wafer chuck, the edge removal module being configured to contact edges of the wafer.

15. The wafer edge trimming apparatus of claim 14, wherein the edge removal module comprises a wedge configured to remove material from the edges of the wafer, and wherein the wedge comprises stainless steel, aluminum, ceramic, silica, silicon dioxide, aluminum oxide, or silicon carbide.

16. The wafer edge trimming apparatus of claim 14, further comprising:
    an abrasive storage apparatus used to store a first abrasive; and
    a water source to provide water, wherein the water jet comprises the first abrasive mixed with water from the water source.

17. The wafer edge trimming apparatus of claim 16, wherein a first velocity of the water jet is in a range from 100 to 1500 m/s.

18. The wafer edge trimming apparatus of claim 16, wherein the first abrasive comprises abrasive particles, wherein each of the abrasive particles has a diameter that is in a range from 10 nm to 500 nm.

19. The wafer edge trimming apparatus of claim 16, wherein the water jet head comprises:
    an abrasive mixing tube used to focus the water jet;
    a water flow tube disposed to be concentrically around the abrasive mixing tube; and
    an air flow tube disposed to be concentrically around the water flow tube and the abrasive mixing tube.

20. The wafer edge trimming apparatus of claim 19, wherein the water flow tube is configured to direct water from the water source towards the top surface of the wafer chuck, wherein the water flows around an outer perimeter of the water jet.

* * * * *